United States Patent [19]
Harcourt

[11] Patent Number: 5,528,356
[45] Date of Patent: Jun. 18, 1996

[54] APPARATUS AND METHOD FOR DISPLAYING MULTIPLE SAMPLE SPACING WAVEFORM SEGMENTS

[75] Inventor: Matthew S. Harcourt, Bend, Oreg.

[73] Assignee: Tektronix, Inc., Wilsonville, Oreg.

[21] Appl. No.: 407,722

[22] Filed: Mar. 20, 1995

[51] Int. Cl.$^6$ .................................................. G01N 21/88
[52] U.S. Cl. ........................................................ 356/73.1
[58] Field of Search ............................................ 556/73.1

[56] References Cited

U.S. PATENT DOCUMENTS

| | | | |
|---|---|---|---|
| 4,812,038 | 3/1989 | Nazarathy et al. | 356/73.1 |
| 5,129,722 | 7/1992 | Mader et al. | 356/73.1 |
| 5,155,439 | 10/1992 | Holmbo et al. | 324/534 |
| 5,365,328 | 11/1994 | Anderson | 356/73.1 |

OTHER PUBLICATIONS

Pending Patent Application, Ser. No. 08/210,820, Filed Mar. 18, 1994 pp. 1–39 and 9 pages of drawings.

Primary Examiner—Vincent P. McGraw
Attorney, Agent, or Firm—William K. Bucher

[57] ABSTRACT

An optical time domain reflectometer acquires and displays waveform data as a waveform trace on a display device having a viewport defined by a start distance and an end distance using waveform data segments having data points where each waveform segment is acquired using different pulsewidth and sample spacing and different starting distance. A processor sets a horizontal pixel skip value and a horizontal distance skip value for each waveform segment and calculates a horizontal distance per pixel value for the display area as a function of dividing the distance between the viewport start distance and the viewport end distance by the number of horizontal pixels in the display area. Each horizontal pixel is mapped to a distance by setting an initial pixel count to zero and sequentially adding the horizontal pixel skip value to the pervious pixel count and setting an initial horizontal distance value to the start distance of the viewport and sequentially adding the horizontal distance skip value to the previous horizontal distance value. The distance values for the horizontal pixels are correlated to amplitude values of the data points of the waveform segment using an index into the array of waveform data points related to distance. The amplitude values of the acquired data are mapped to appropriate vertical pixels associated with the horizontal pixels to produce a bit representation of the waveform trace, which is displayed on the display device.

16 Claims, 21 Drawing Sheets

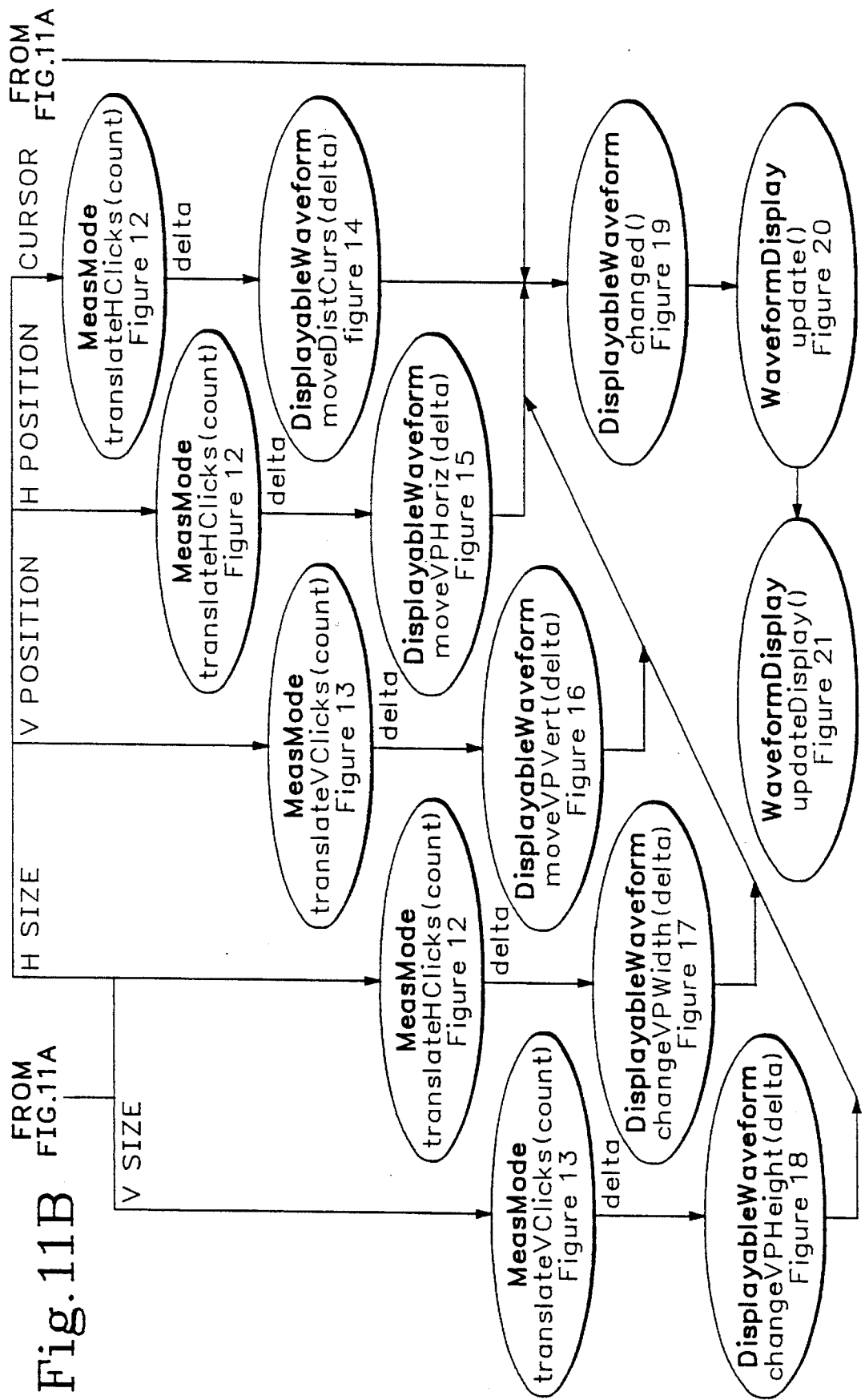

DisplayableWaveform
moveDistCurs(delta)

↓ delta add delta to active CursorModel's distance
limit new distance to within clipping ViewPort
set distance of active CursorModel to new distance
mark change in active CursorModel distance

Fig. 14

DisplayableWaveform
moveVPHoriz(delta)

↓ delta add delta to active ViewPort's center distance
limit new distance to within clipping ViewPort
set center distance of active ViewPort to new distance
mark change in active ViewPort distance

Fig. 15

DisplayableWaveform
moveVPVert(delta)

↓ delta add delta to active ViewPort's center amplitude
limit new amplitude to within clipping ViewPort
set center amplitude of active ViewPort to new amplitude
mark change in active ViewPort amplitude

Fig. 16

APPARATUS AND METHOD FOR DISPLAYING MULTIPLE SAMPLE SPACING WAVEFORM SEGMENTS

BACKGROUND OF THE INVENTION

The present invention relates generally to acquiring and displaying waveform data and more specifically to an apparatus and method for displaying waveform data having multiple segments with different sample spacings acquired using a measurement test instrument, such as an optical time domain reflectometer.

A traditional optical time domain reflectometer (OTDR) tests a fiber by acquiring a single waveform to represent an entire display trace of the fiber under test. The OTDR, under operator control, determines the portion of the test fiber to be examined, the pulse width of the optical pulses to be launched in to the test fiber, the sample density or spacing between acquired data points, the amount of averaging for each acquired data point, and the like. A series of optical pulses are launched into the test fiber. During the period between each test pulse, a return reflected optical signal is received, converted to an electrical signal and sampled in accordance with the preselected sample density. The acquired waveform data is stored in memory and further processed to locate and measure events on the test fiber. When using this technique, a trade off must be made between resolution and dynamic range. The resulting acquired waveform consists of a series of evenly spaced, constant sample spacing data points that are easily displayed on a display screen of the OTDR. Each data point of the acquired data displayed on the display screen is mapped to an x and a y coordinate of the display. Generally, the number of acquired data points is substantially greater than can be displayed on the display screen. The waveform trace displayed on the display screen is generated using some form of decimation where a constant number of data points are skipped between each data point that is displayed. A waveform, for the purposes of this specification, refers to the data collected from a single acquisition. This data has a single sample density and number of averages (i.e. the number of averages and the distance between samples is the same for each data point in the waveform). A trace refers to the traditional representation of the fiber that is presented to the user of the OTDR (i.e. the backscatter with Fresnel reflections and other events that appear on the OTDR display or hardcopy).

An example of the above described optical time domain reflectometer is the TFP2 Optical Time Domain Reflectometer manufactured and sold by Tektronix, Inc., Wilsonville, Oreg., the assignee of the present invention. A feature of the TFP2 OTDR is an expansion windowing system as described in U.S. Pat. No. 5,129,722. The expansion windowing system has first and second viewports with the first viewport displaying the waveform trace in a display area of the OTDR and the second viewport displaying a portion of the waveform trace from the first viewport in an expanded form. The second viewport is moveable in the first viewport as a function of a movable cursor in the display area, which intersects the waveform trace. Means are provided for varying the dimensions of the second viewport about the cursor/waveform intersection when the first viewport in the display area. As was previously described, the number of acquired data points is substantially greater than the number of data points that can be displayed on the display screen. The expansion windowing system takes advantage of this by being able to expand on a portion of the waveform trace in the first viewport and displaying that portion of the trace in the second viewport in greater detail by skipping fewer data points between the data points being mapped to the display screen.

An alternative method of acquiring waveform data in an OTDR type instrument is described in U.S. Pat. No. 5,155,439, assigned to the assignees of the present invention. The optical fault locator launches optical pulses into a test fiber at a first pulse width. The return reflected optical signal is converted to an electrical signal, digitized, stored and processed to locate anomalous events in the fiber. Any region of the test fiber having an anomalous event is reexamined using optical pulses having a pulse width optimized for the that region of the fiber. A symbolic display is used to indicate the location and type of event located in the fiber instead of the traditional waveform trace.

The trade-offs between OTDR resolution and dynamic range are optimized in the TFS3030 Mini-OTDR, manufactured and sold by Tektronix, Inc., Wilsonville, Oreg. The TFS3030 analyzes a fiber under test by acquiring several waveforms at different pulsewidths. Each waveform represents a different segment of the fiber, and each waveform is acquired using the shortest pulsewidth that is capable of testing the distances spanned by that segment of the fiber. Further, each waveform is acquired using a different sample density based on the pulsewidth. These waveforms are analyzed independently as they are acquired and the results are used to build a table of the events for the fiber, and to determine the acquisition parameters, e.g. pulsewidth and sample density, for acquiring the next waveform over the next segment of fiber. Each subsequent waveform segment acquisition overwrites the previously acquired waveform segment data. The resulting table of events for the various fiber segments is displayed on a display screen or stored for future reference. This method of testing the fiber has proven to be very accurate and efficient for locating events on a fiber. However, the TFS3030 does not use the acquired waveform segments to display a trace on the display screen representing the fiber under test.

One method of generating a wavform trace to go along with the table of events is to perform an additional acquisition to acquire a waveform that spans the entire fiber as was described for the TFP2 OTDR. While this would generate a trace of the fiber to go with the table, the data displayed to the user would not be the same data used to generate the table, and because a longer pulsewidth would be required to acquire the entire trace, it would not be as accurate as the individual waveform segment traces. The additional acquisition would also increase the time for testing the fiber and also increase the amount of memory necessary for storing waveform data.

A preferable type of OTDR would combine the advantages of the waveform segment acquisition technology of the TFS3030 and the waveform display capability of the TFP2. Such an OTDR should have the capability to test multimode optical fibers at 850 nm and 1300 nm and singlemode optical fiber at 1310 nm and 1550 nm. Below is a table showing representative parameters for acquiring singlemode waveform segments using the combined technology.

Singlemode Waveform Segments

| Segment # | Pulsewidth | Sample Spacing | Start Distance | Stop Distance | # of Data Points |
|---|---|---|---|---|---|
| 1 | 2 m | 0.5 m | 0 km | 2 km | 4000 |
| 2 | 5 m | 1 m | 2 km | 6 km | 4000 |
| 3 | 20 m | 5 m | 6 km | 26 km | 4000 |
| 4 | 100–500 m | 10 m | 26 km | 66 m | 4000 |
| 5 | 1 km | 20 m | 66 km | 106 km | 2000 |
| 6 | 2 km | 50 m | 106 km | 206 km | 2000 |
| | | | Total # of Singlemode Data Points | | 20000 |

As can be seem in the table, the sample density of segment 6 at 50 meters is 100 times that of segment 1 at 0.5 meters. One way to combine the segments so that they can be manipulated and displayed using the same sample spacing as in the TFP2 OTDR is to interpolate, the segments that have larger sample spacing. For example, make the segment with 1 meter sample spacing appear to have 0.5 meter sample spacing by interpolating between data points and adding a data point between existing samples. For segments with meter sample spacing, the interpolation would have to add 10 data points between samples. The following table shows the results of interpolation of the segments for the singlemode case.

Interpolation of Singlemode Waveform Segments

| Segment # | Pulsewidth | Sample Spacing | # of Data Points | Interpolated Sample Spacing | Interpolated # of Data Points |
|---|---|---|---|---|---|
| 1 | 2 m | 0.5 m | 4000 | 0.5 m | 4000 |
| 2 | 5 m | 1 m | 4000 | 0.5 m | 8000 |
| 3 | 20 m | 5 m | 4000 | 0.5 m | 40000 |
| 4 | 100–500 m | 10 m | 4000 | 0.5 m | 80000 |
| 5 | 1 km | 20 m | 2000 | 0.5 m | 80000 |
| 6 | 2 km | 50 m | 2000 | 0.5 m | 200000 |
| | | Total # of Interpolated Data Points | | | 412000 |

As can be seen in the above table, interpolating the waveform segments results in a very large number of data points, requiring more memory to store the data. This increases the cost of the instrument. There is also a reduction in the speed of the instrument in that additional time is required to perform the interpolation, storing and processing the data to generate the displayed trace.

Another way to combine segments so that they can be manipulated and displayed is to decimate the segments that have smaller sample spacing so that all segments have the same sample spacing. For example, make the segment with 10 meters sample spacing appear to have 20 meter sample spacing by removing every other sample. The following table shows the result of decimating the segments for the singlemode case.

Decimation of Singlemode Waveform Segments

| Segment # | Pulsewidth | Sample Spacing | # of Data Points | Decimated Sample Spacing | Decimated # of Data Points |
|---|---|---|---|---|---|
| 1 | 2 m | 0.5 m | 4000 | 50 m | 40 |
| 2 | 5 m | 1 m | 4000 | 50 m | 80 |
| 3 | 20 m | 5 m | 4000 | 50 m | 400 |
| 4 | 100–500 m | 10 m | 4000 | 50 m | 800 |
| 5 | 1 km | 20 m | 2000 | 50 m | 800 |
| 6 | 2 km | 50 m | 2000 | 50 m | 2000 |
| | | Total # of Decimated Data Points | | | 4120 |

In this case, the total number of data points does not present a problem. However, the result of the waveform decimation is that first waveform segment ends up with only 40 data points to cover a 2 kilometer span. This reduces the resolution significantly in a region that the resolution adds significant benefit, for example identifying jumpers used to connect the OTDR to the fiber under test. Not only is the resolution reduced, but it is possible that reflective events will be removed from the data during the decimation process. Further, there are not enough data points in the first two segments to provide an expanded waveform trace that provides any significant meaning. Therefore, the decimation process does not provide the desired results.

To avoid loosing information in the decimation process a combination of decimation and interpolation could be used. Using this technique, a target sample density is chosen so that no information would be lost in the decimation process. For the singlemode case above, a 2 meter sample density is chosen so that at least one data point exists for each pulse width of the shortest pulse width segment. The remaining segments are then decimated or interpolated to match this sample density. The results of this technique for the singlemode case is shown in the table below.

Interpolation & Decimation of Singlemode Waveform Segments

| Segment # | Pulsewidth | Sample Spacing | # of Data Points | Decimated Sample Spacing | Decimated # of Data Points |
|---|---|---|---|---|---|
| 1 | 2 m | 0.5 m | 4000 | 2 m | 1000 |
| 2 | 5 m | 1 m | 4000 | 2 m | 2000 |
| 3 | 20 m | 5 m | 4000 | 2 m | 10000 |
| 4 | 100–500 m | 10 m | 4000 | 2 m | 20000 |
| 5 | 1 km | 20 m | 2000 | 2 m | 20000 |
| 6 | 2 km | 50 m | 2000 | 2 m | 50000 |
| | | Total # of Data Points | | | 103000 |

The result is still a very large number of data points requiring more memory. There is also a reduction in the speed of the instrument in that additional time is required to perform the interpolation and decimation process, storing and processing the data to generate the displayed trace.

Combining waveform data in an OTDR is described in U.S. patent application Ser. No. 08/210,820, filed Mar. 18, 1994, entitled "An Optical measurement Instrument and Wide Dynamic Range Optical Receiver for Use Therein", assigned to the assignees of the present invention. The combining of waveforms is the result of acquiring waveform data sets over the total fiber under test using different optical power levels inputs to a low and a high sensitivity channel. In addition, the gain of the photosensitive device in the high sensitivity channel is varied. This produces waveform data sets that either have low sensitivity to low signal levels or saturate the optical receiver. The low sensitivity signal channel receives in the range of one to ten percent of the return optical signal and the high sensitivity channel receives approximately ninety to ninety-nine percent of the low optical return signal. The sets of waveform data from the low and high sensitivity channels are acquired using the same pulse width and sample spacing and are correlated both vertically and horizontally and combined to produce a composite waveform where the waveform data from each data set is neither saturated nor in the electrical noise floor of the instrument.

What is needed is an apparatus and method for displaying acquired waveform segments in a measurement test instrument like an OTDR where the waveform segments have different sample densities. The method should use the existing acquired waveform segment data without having to interpolate or decimate the data thus requiring increased instrument memory and increased processing time.

SUMMARY OF THE INVENTION

Accordingly, the present invention is an optical time domain reflectometer for launching; optical pulses into a fiber under test for generating an optical return signal from the test fiber for acquiring and displaying waveform data as a waveform trace on a display device having a display area defined by a number of horizontal pixels and a number of vertical pixels and a viewport defined by a start distance and an end distance and a min and max amplitude. The optical time domain reflectometer includes an acquisition system for acquiring at least two waveforms segments having data points representative of the optical return signal. Each data point has an amplitude value related by time to a distance and each, waveform segment is acquired using a different pulsewidth optical pulse, a different sample spacing and a different staring distance. A processor receives the data points of the waveform segments and determines the starting distance of the second and any subsequent waveform segment. The processor also generates a waveform data segment table containing the start distances, the sample spacing and an index into the array of waveform data points related to distance for each waveform segment. The processor further generates a bit map array representative of the waveform trace by establishing a horizontal pixel skip value and a horizontal distance skip value and calculating a horizontal distance per pixel value for the display area as a function of dividing the distance between the viewport start distance and the viewport end distance by the number of horizontal pixels in the display area. The processor maps the horizontal pixels to distances by setting an initial pixel count to zero and an initial horizontal distance value to the viewport start distance and sequentially adding the horizontal pixel skip value to the pervious pixel count and adding the horizontal distance skip value to the previous horizontal distance value. The processor correlates the distance values for the horizontal pixels to the amplitude values of the data points of the waveform segment using the indexes of the data points related to distance and maps the amplitude values to the appropriate vertical pixels associated with the horizontal pixels. A memory stores the amplitude value of each data point of the respective waveform segments, the waveform segment table, and the bit map array representative of the waveform trace. A display means including a display controller coupled to the display device receives and displays the bit map representation of the waveform trace on the display device. The waveform trace is updated with the array of waveform data points for each acquisition of a waveform segment.

The processor in the optical time domain reflectometer for acquiring segmented waveform data and displaying waveform data as a waveform trace establishes the horizontal pixel skip value to one and the horizontal distance skip value to the horizontal distance per pixel value or calculates a new horizontal pixel skip value as a function of dividing the sample spacing of the waveform segment by the horizontal distance per pixel value and establishes a new horizontal distance skip value equal to the sample spacing of the waveform segment if the horizontal distance per pixel value is less than the sample spacing of the waveform segment. Further, the processor determines a distance value for the last data point in the array of waveform data as a function of the index into the array of waveform data points related to distance, stores the distance value for the last data point in the waveform segment, compares the distance value of the last data point in the waveform segment to the horizontal pixel distances, and terminates the mapping of the waveform data to the bit map array when the horizontal pixel distance is greater than the distance value of the last data point of the waveform segment. The processor also compares the start distance of the first waveform segment to the horizontal pixel distances and increments the horizontal pixel count and the horizontal distance value while the horizontal pixel distance is less than the starting distance of the first waveform segment.

In a further embodiment of the present invention, the optical time domain reflectometer concurrently acquires the next waveform segment while processing the current waveform segment to updated the array of waveform data points and generate the bit map array and the waveform trace.

A method of displaying the waveform data as a waveform trace on a display device having a display area defined by a number of horizontal pixels and a number of vertical pixels and a viewport defined by a start distance and an end distance in an optical time domain reflectometer storing an array of waveform data points having at least two waveform segments with each waveform segment having data points acquired using different pulsewidths, sample spacings and starting distances and each data point having an amplitude value and an index into the array of waveform data points related to distance includes the steps of establishing a horizontal pixel skip value and a horizontal distance skip value and calculating a horizontal distance per pixel value for the display area as a function of dividing the distance between the viewport start distance and the viewport end distance by the number of horizontal pixels in the display area. Mapping of the horizontal pixels to distances is performed by setting an initial pixel count to zero and sequentially adding the horizontal pixel skip value to the pervious pixel count and setting an initial horizontal distance value to the start distance of the viewport and sequentially adding the horizontal distance skip value to the previous horizontal distance value. Correlating the distance values for the horizontal pixels to the amplitude values of the data points of the waveform segment is accomplished using the indexes of the data points related to distance. A further step is performed to map the amplitude values to the appropriate vertical pixels associated with the horizontal pixels in a bit mapped video frame buffer for displaying on the display device. The steps of mapping the horizontal pixels to distances, correlating the horizontal pixel distance values and mapping the amplitude values are repeated using the subsequent waveform segments for producing the waveform trace of the waveform data on the display device as the distance values for the horizontal pixels extend beyond the starting distance of the subsequent segments.

The method of displaying waveform data according to the present invention further includes the preliminary step of generating a waveform data segment table for the array of waveform data points having the starting distances for the waveform segments, the sample spacings for the waveform segments, and the indexes to the first data points of the waveform segments in the array of waveform data points related to distances. Additional steps includes setting the horizontal pixel skip value to one and the horizontal distance skip value to the horizontal distance per pixel value and calculating a new horizontal pixel skip value as a function of dividing the sample spacing of the waveform segment by the horizontal distance per pixel value and establishing the horizontal distance per pixel value equal to sample spacing of the waveform segment if the horizontal distance skip value is less than the sample spacing of the waveform segment.

A further embodiment of the method of display waveform data according to the present invention includes the additional steps in the mapping step of determining a distance value for the last data point in a waveform segment as a function of the index into the array of waveform data points related to distance, storing the distance value for the last data point in the waveform segment, comparing the distance value of the last data point in the waveform segment to the horizontal pixel distances, and terminating the displaying of the waveform data when the horizontal pixel distance is greater than the distance value of the last data point of the waveform segment. Further steps included in the mapping step include comparing the start distance of the first waveform segment to the horizontal pixel distances, and incrementing the horizontal pixel count by adding the horizontal pixel skip value to the previous pixel count and incrementing the horizontal distance value by the horizontal distance skip value to the previous distance value while the horizontal pixel distance is less than the starting distance of the first waveform segment. The correlating step further includes the additional steps of comparing the horizontal pixel distance value to the starting distances of the various waveform segments for determining the waveform segment containing the data point to be correlated to the horizontal pixel, determining the distance from the starting distance of the waveform segment determined in the comparing step to the data point correlated to the horizontal pixel as a function of subtracting the starting distance for the waveform segment from the horizontal pixel distance, determining the index of the data point correlated to the horizontal pixel as a function of dividing the result of previous determining step by the sample spacing for the waveform segment and adding the index of the starting distance for the waveform segment, and accessing the amplitude value for the horizontal pixel using the results in last determining step as the index into the amplitude values of the data points. The objects, advantages and novel features of the present invention are apparent from the following detailed description when read in conjunction with the appended claims and attached drawings.

BRIEF DESCRIPTION OF THE DRAWINGS

FIGS. 8–25 show how the software objects communicate with one another in response to a user interface event in the optical time domain reflectometer using the method for displaying wavform segments having different sample densities as a waveform trace according to the present invention.

DETAILED DESCRIPTION OF THE PREFERRED EMBODIMENT

Figure 1:
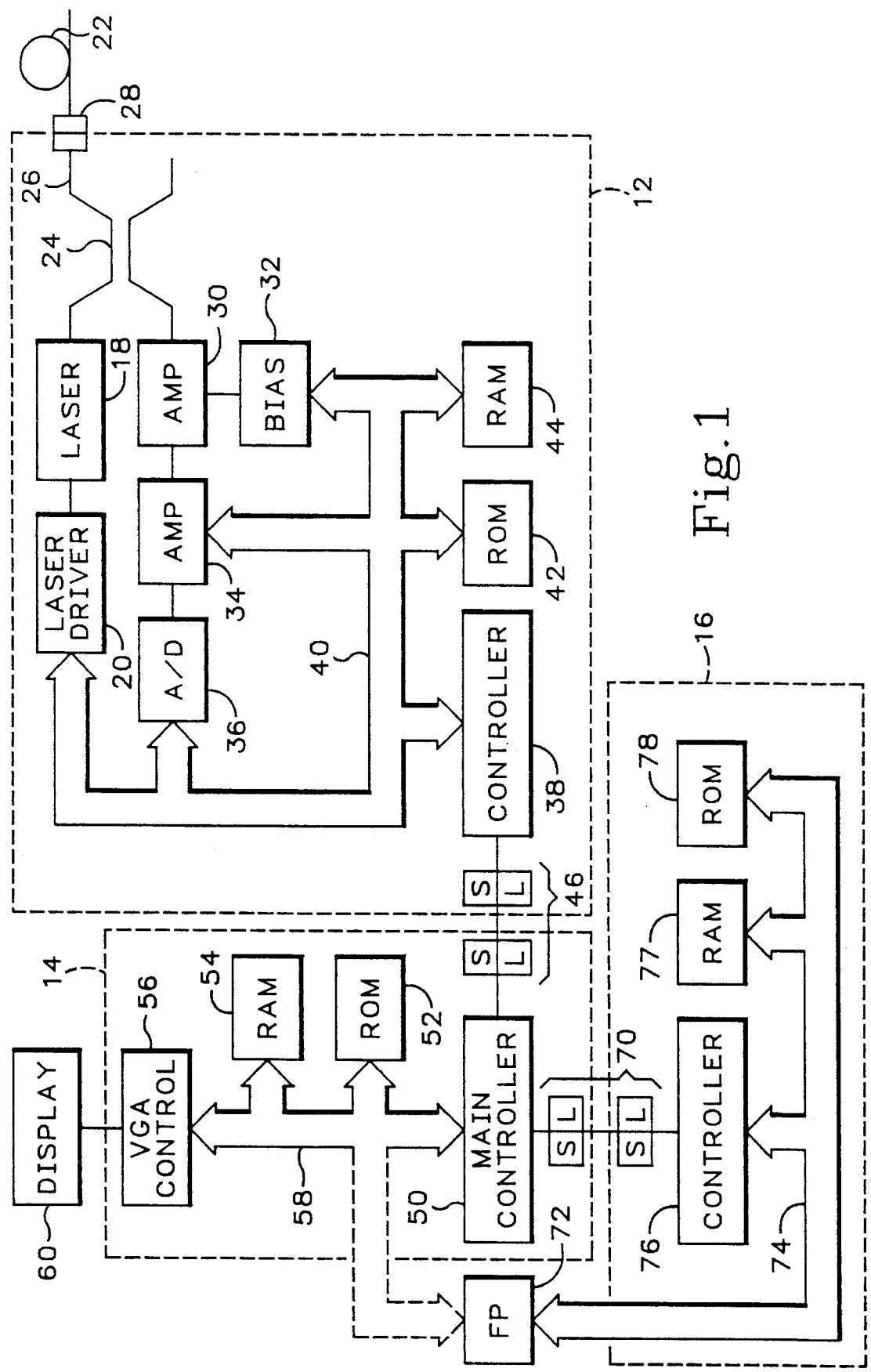
FIG. 1 is a block diagram of an optical time domain reflectometer using the method of displaying waveform segments having different sample densities as a waveform trace according to the present invention.

Referring to FIG. 1 there is shown a block diagram of an optical time domain reflectometer, OTDR, 10 using the method for displaying waveform segments having different sampling densities according to the present invention. The OTDR comprises a digital acquisition section 12 (DAS), a main processing section 14, and a power supply section 16. The DAS 12 has a laser diode 18 that is energized intermittently by a laser driver 20 to launch interrogating pulses into a test fiber 22 by the way of a directional coupler 24 and a launch fiber 26, which is connected to test fiber 22 by a connector 28. OTDR 10 receives return light from the test fiber 22 due to Rayleigh backscattering and Fresnel reflections. The intensity of the backscattered and reflected light depends on the condition of the test fiber 22.

A portion of the return light received from the test fiber 22 is coupled through coupler 24 to a photodetector 30, such as an avalanche photodiode, APD, which generates a current signal representative of the intensity of the return light. The avalanche photodiode 30 is coupled to a voltage biasing circuit 32, which applies a varying voltage to the APD 30 for varying the gain of the device. The current signal from the APD 30 is converted to a voltage signal and amplified by a variable gain transimpedance amplifier 34. The amplified voltage signal is sampled and converted to a digital form by analog-to-digital converter (ADC) 36. A digital signal processor controller 38 controls the timing of the ADC 36 relative to the laser driver 20, the voltage output of the voltage biasing circuit 32 and the gain of the transimpedance amplifier 34 via digital bus 40 in response to executable routines stored in ROM 42. ROM 42 and RAM 44 are also coupled to the bus 40. RAM 44 accumulates the digital data values from the ADC 36 representative of the light intensity at selected points in the test fiber in a data buffer. Repetitive interrogations of the test fiber 22 provide additional digital data values at the selected points, which are averaged with previously stored values. RAM 44 also stores parameter data passed to the DAS 12 from the main processor section 14 via serial data link 46. The averaged data values in RAM 44 are transferred to the main processor section 14 via the serial data link 46.

The main processor section 14 includes a controller 50, such as a Motorola 68340 microprocessor, coupled to ROM 52, RAM 54 and a display controller 56 via digital bus 58. In the preferred embodiment the ROM 52 is downloadable flash EPROMs and the display controller 56 is a standard VGA type controller coupled to a 640×480 pixel array display device 60, such as a liquid crystal LCD display, cathode ray tube or other device having a rectangular array of addressable pixels. The ROM 52 contains control logic and waveform processing routines defining objects. Objects will be discussed in greater detail below. RAM 54 includes a data buffer for receiving the waveform segment data from the DAS 12. RAM 54 also includes a video frame buffer for storing bit mapped data to be displayed on the display device 60.

In the preferred embodiment of the OTDR incorporating the method of displaying waveform segments having varying sample densities, the main processor section 14 is coupled via a serial link 70 is the power supply section 16. The power supply section 16 is coupled to OTDR 10 front panel 72 via digital bus 74. The power supply section 16 includes a controller 76 and associated control programs, stored in ROM 78, for providing power management and front panel control functions and RAM 77 for storing data related to the power management function. The controller 76 poles the front panel 72 to determine if one of the its buttons is pushed. Alternatively, the front panel may be provided with knobs as well as buttons. The controller 76 generates a key code based on the front panel activity and couples the key code to the controller 50 in the main processor section 14 via the serial link 14. The controller 50 generates the appropriate system signal request based on the key code. In the preferred embodiment, the OTDR 10 may be battery operated or coupled to a standard 110 volt AC voltage supply. When operating on a battery supply, the controller 76 monitors battery charging and battery usage and provides an indication of battery usage and remaining battery life. An alternative arrangement for OTDR 10 is to couple to the front panel 72 to the controller 50 of the main processor section 14 via digital bus 58.

Figure 2:
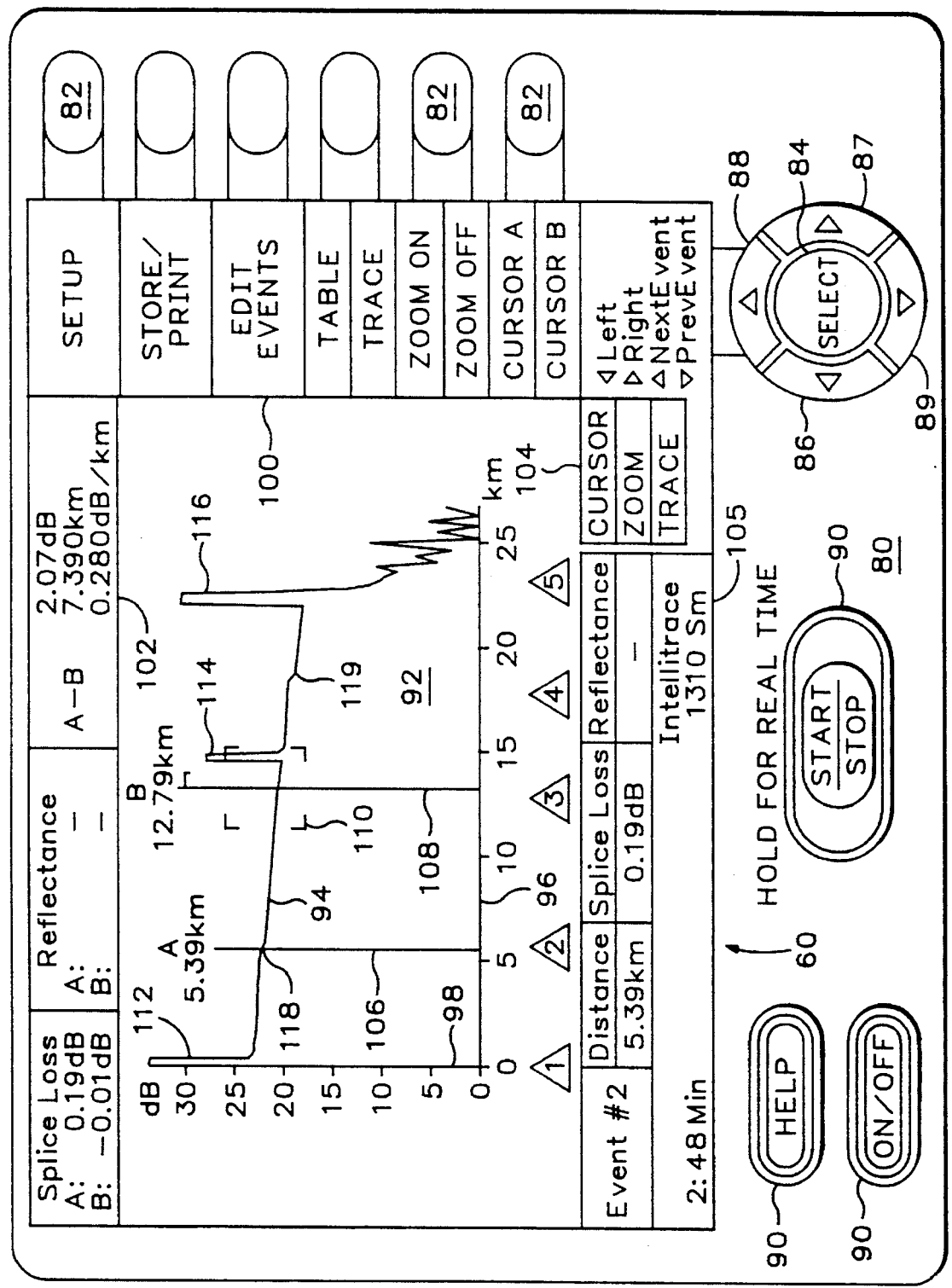
FIG. 2 is a user interface for the optical time domain reflectometer using the method for displaying wavform segments having different sample densities as a waveform trace according to the present invention.

Referring to FIG. 2, there is shown the user interface 80 of the OTDR 10 having a number of softkeys 82, a select button 84 and left, right, up and down arrow buttons, respectively numbered 86, 87, 88, and 89, associated with the display device 60. The user interface 80 includes additional buttons and switches, such as 90, for starting and stopping waveform acquisitions, turning the instrument on and off, and providing on screen help. The display device 60 includes a display area 92 having a 640×480 pixel array. This array corresponds to one video frame in the video display memory. The display area 92 shows a waveform trace 94 representative of the acquired waveform data segments from the DAS 14 of the OTDR. The horizontal and vertical scales, respectively numbered 96 and 98, are provided as well as an area 100 for displaying information describing the functionality of the softkeys 82 and areas 102, 104 and 105 for displaying the instrument set-up and information relating to measurement values, distances and the like. The portion of the display area 92 designated for the waveform trace 94 has an approximate 350×500 pixel array. Cursors 106 and 108 are provided with either cursor being the active movable cursor as set by the appropriate softkey 82. Movement of the active cursor is provided by the interaction of select button 84 and the left and right arrow buttons 86 and 87. Cursor 108 is shown in the figure as the active movable cursor.

Cursor softkey 82 works in conjunction with the select button 84 and the left and right arrow buttons 86 and 87 for controlling the position of the active movable cursor 108 in the display area 92. The cursor softkey 82 controls which cursor is the active cursor and which is the inactive cursor. Activating the cursor softkey 82 makes the inactive cursor 106 the active cursor and the active cursor 108 the inactive cursor. A start/stop switch 86 activates the laser and acquisition hardware for launching interrogation pulses into the fiber 22 and for acquiring the data representative of the return light from the fiber 22. The display area 92 also shows an expansion window 110 defined by the corner icons. The dimensions of the expansion window 110 are controlled by the left, right, up, and down arrow buttons 86–89 in conjunction with the select button 84. A zoom softkey 82 is used for replacing an overview viewport containing the waveform 94 with an expanded viewport defined by the expansion window 110 and containing that portion of the waveform trace 94 in an expanded form. The select button 84 in conjunction with the arrow buttons 86–89 also controls the positioning of the trace 94 in the display area 92. For example, the information display area 100 shows that cursor softkey 82 has been activated to make cursor 108 is the active cursor. Display area 105 shows that the cursor area has been highlighted using the select button. The right and left arrow buttons 86 and 87 move the cursor 108 in the display area 92. Depressing the select button 84 highlights the zoom area in the information display area 105 and switches the arrow buttons 86–89 to control the dimensions of the expansion window 110. The left and right arrow buttons 86 and 87 control the horizontal dimensions of the expansion window 110 and the up and down arrow buttons control the vertical dimension of the expansion window 110. The zoom softkey 82 is used for replacing the overview viewport with the expanded viewport having an expanded display of the portion of the waveform trace 94 defined by the expansion window 110. Depressing the select button 84 highlights the trace area in the information display area 105 and switches the arrow buttons 86–89 to control the position of the trace 94 in the display area 92. The left and right arrow buttons 86 and 87 positions the display trace 94 horizontally in the display area 92 and the up and down arrow buttons position the trace 94 vertically in the display area 92. The select button 84 sequentially highlights the respective cursor area, zoom area and trace area each time it is depressed.

Information display area 104 shows the OTDR 10 set-up in IntelliTrace™ mode using a 1310 nm laser for examining a single mode optical fiber. The IntelliTrace™ mode acquires and stores waveform data points having multiple waveform segments with each waveform segment having data points acquired using different pulsewidths, sample spacing and starting distances. The table below shows the representative parameters for acquiring singlemode waveform segments using either 1310 nm or 1550 nm lasers diodes 18 as the optical source.

| Singlemode Waveform Segments | | | | | |
|---|---|---|---|---|---|
| Segment # | Pulsewidth | Sample Spacing | Start Distance | Stop Distance | # of Data Points |
| 1 | 2 m | 0.5 m | 0 km | 2 km | 4000 |
| 2 | 5 m | 1 m | 2 km | 6 km | 4000 |

Singlemode Waveform Segments

| Segment # | Pulsewidth | Sample Spacing | Start Distance | Stop Distance | # of Data Points |
| --- | --- | --- | --- | --- | --- |
| 3 | 20 m | 5 m | 6 km | 26 km | 4000 |
| 4 | 100–500 m | 10 m | 26 km | 66 m | 4000 |
| 5 | 1 km | 20 m | 66 km | 106 km | 2000 |
| 6 | 2 km | 50 m | 106 km | 206 km | 2000 |
| | | | Total # of Singlemode Data Points | | 20000 |

A characteristic of the waveform trace 94 having variable pulsewidth waveform segments is that the events, such as reflective events 112, 114 and 116 and reflectionless loss events 118 and 119, have differing widths depending on the segment they occur in.

The preferred embodiment of the invention also includes multimode acquisitions at 850 nm and 1300 nm wavelengths. The tables below shows the representative parameters for acquiring multimode waveform segments using 850 nm and 1300 nm laser diodes 18 as optical sources.

| Segment # | Pulsewidth | Sample Spacing | Start Distance | Stop Distance | # of Data Points |
| --- | --- | --- | --- | --- | --- |
| 850 Multimode Waveform Segments | | | | | |
| 1 | 1 m | 0.25 m | 0 km | 1 km | 4000 |
| 2 | 2 m | 0.5 m | 1 km | 3 km | 4000 |
| 3 | 5 m | 1 m | 3 km | 5 km | 2000 |
| 4 | 10 m | 2 m | 5 km | 13 m | 4000 |
| | | Total # of 850 Multimode Data Points | | | 14000 |
| 1300 Multimode Waveform Segments | | | | | |
| 1 | 2 m | 0.5 m | 0 km | 2 km | 4000 |
| 2 | 5 m | 1 m | 2 km | 6 km | 4000 |
| 3 | 20 m | 5 m | 6 km | 16 km | 2000 |
| 4 | 100 m | 10 m | 16 km | 35 m | 2000 |
| | | Total # of 1300 Multimode Data Points | | | 12000 |

As can be seem in the above multimode tables, the number of waveform segments acquired for the multimode waveform trace is four instead of the six waveform segments for singlemode waveform trace. The present invention is not limited to the specific parameters and number of waveform segments acquired for a waveform trace as shown above or described further below and the parameters and number of waveforms segments acquired may vary without departing from the scope of the claimed invention.

The method of displaying segmented waveforms having varying sample densities of the present invention is implemented as part of an overall software control system for a measurement test instrument that is designed using object oriented programming (OOP). Object oriented programming is different from traditional programming in that it introduces the concept of combining data and procedures into groupings called objects. Each object belongs to a class, which may be viewed as providing a template into which data is stored and the procedures for accessing and manipulating the object's data to produce some result. An object in a class is referred to as an instance of a class that contains specific data. An object is a single entity containing data and the procedures operating on the data and cannot be thought of as a separate data structure, such as an array, and separate procedures working on that data structure as in traditional programming languages. The behavior of an object is defined by the procedures that are available to the object. OOP also introduces a concept called inheritance where a subclass, derived from a base class, inherits the data and functional capabilities of the base class. Inheritance arises from the fact that objects consist of both data and the functions that operate on the data. For example, a data base system may be designed that contains information on customers, suppliers and employees. Common information on customers, suppliers and employees, such as name and address, are defined in a first class, which has associated procedures that operate on the data contained in the class. Specific information related to customers, suppliers and employees, such as type and quantity of product ordered, type and quantity of product supplied and employee ID number, are defined in separate subclasses derived from the base class. Each separate subclass inherits the data template and functional capabilities of the base class containing the names and addresses. Therefore, the data template for the customer subclass contains the fields for the customer information on type and quantity of product ordered and inherits fields for the name and address of the customer from the base class it was derived from. Additional subclasses may be defined from an existing subclass with any new subclass inheriting all of the data and functional capability from the classes in the hierarchy. Inheritance is a useful feature in implementing OOP but it is not necessary. An OOP system may be designed with independent objects that do not inherit behaviors from other objects. Another important concept in OOP languages, such as Smalltalk 80, C++, and the like, is that an object cannot operate directly on another object without circumventing the interface defined for the object. To get data or a result from another object, it normally requires a message to be sent from a requesting object, requesting the information, and a requested object performs the necessary procedure to retrieve the information and pass it back to the requesting object.

Figure 3:
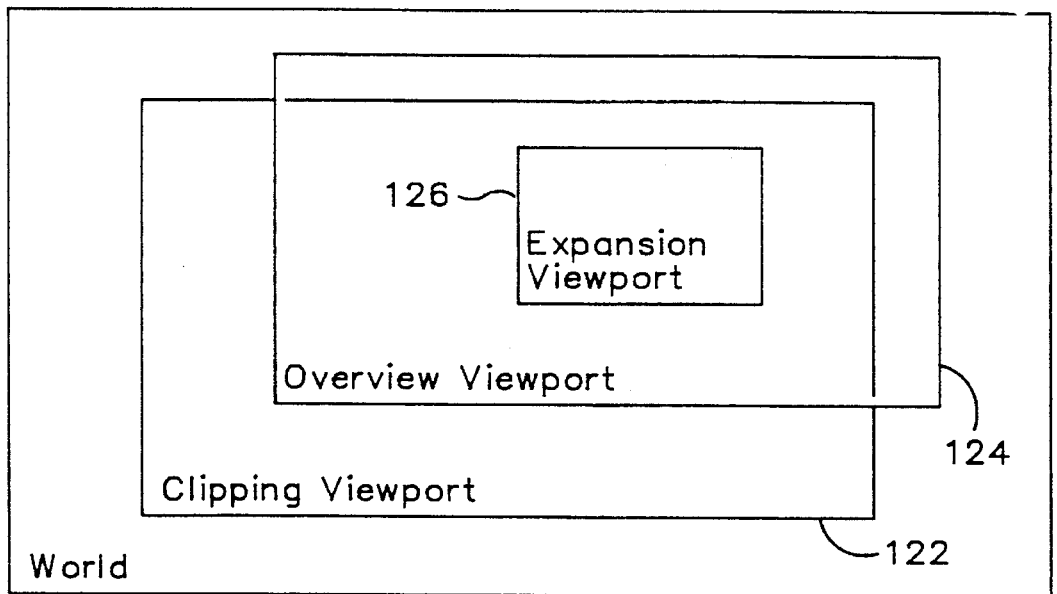
FIG. 3 is a representation of the coordinate system for defining dimensions in the viewports in the optical time domain reflectometer using the method for displaying wavform segments having different sample densities as a waveform trace according to the present invention.

Referring to FIG. 3, there is shown a representation of various viewports of the optical time domain reflectometer using the method for displaying waveform segments having different sample densities of the present invention. A viewport object is defined which specifies the area enclosed by the viewport in terms of world coordinates 120. The world coordinates 120 are in dB's in the vertical direction and in distance (km or kft) in the horizontal direction. As implemented in the preferred embodiment, the amplitude data values are stored as integers representing the output of the acquisition hardware, and the horizontal distances are related to the sample spacing of the various acquired waveform segments and the starting distances of the segments. The viewport object maintains the minimum and maximum amplitudes and distances (the left, right, bottom and top edges) of the area covered by the viewport, and includes routines for manipulating the viewport, such as changing the width or the height, or shifting the viewport in either direction.

A clipping viewport 122 defines the boundaries for overview and expansion viewports, respectively numbered 124 and 126. In the preferred embodiment, the minimum and maximum amplitudes of the clipping viewport 122 remained fixed at −20 and 50 dB. The right edge of the clipping viewport 122 varies with the acquisition mode selected by the user. In the preferred embodiment of the present invention, the IntelliTrace™ mode defines the farthest point on the test fiber 22 for which data can be acquired. The left edge of the clipping viewport 122 is set to the lesser of 0 km or the distance at the left edge of the waveform being displayed.

The overview viewport 124 defines the area that is viewed in the display area 92 in the IntelliTrace™ mode. The height of the overview viewport is defined by the dynamic range of the acquisition hardware. The width is set to enclose the entire range of the acquisition, which varies with changes in the maximum range setting and the acquisition mode selected. The expansion viewport 126 defines the area that is viewed in the display area 92 when a waveform is expanded or zoomed.

The cursors 106 and 108, the waveform trace 94, the expansion window 110, and the, viewports 124 and 126 are manipulated by activating buttons on the user interface 80. The controller 76 on the power supply board 16 poles the front panel and generates a key code each time a button is activated. An EvtProc process object associated with the system processor 50 receives the key code via the serial link 70. The EvtProc object sets up memory locations, acting as registers, according to the button pressed and calls doFPInterrupt(). In order to manipulate the viewports, these key codes must be interpreted as some sort of change that is to take place on the viewport. By pressing one of the arrow buttons 86–89 one time, it is assumed that the user is trying to produce the smallest possible visible change in the display area 92. In most cases the smallest visible change is one pixel. Therefore the button press must be interpreted as a pixel, and translated into world coordinates (dB's or distance). This change in amplitude or distance is applied to the appropriate object (a cursor or viewport or both). The present invention is implemented in an OTDR having a user interface 80 consisting of buttons. The user interface can equally well be implemented with both button and knobs with the knobs controlling the movement of the cursors, 106 and 108, the expansion window 110, the display trace 94, and any other function designed into the interface. In such an implementation, the key code specifies the button activated or which knob is turned, the direction it is turned, and the number of clicks it is turned. As with the arrow buttons 86–89, these event clicks must be interpreted as some sort of change that is to take place on the viewport. By turning a knob one click in either direction, it is assumed that the user is trying to produce the smallest possible visible change in the display area 92. The accompanying figures show both button and knob events with cursor, expansion window and waveform trace movements associated with knob clicks. It is understood, that a knob click is equivalent to an arrow button being pressed. Further, the knob events are shown in the figures for completeness in that the present invention may be implemented in an OTDR using both buttons and knobs.

Once the viewport information has been changed, it is displayed in the display area 92 of the display device 60 by a display process operating on the system controller 50. The display process translates the distance and amplitude information into pixels. The display process specifies the objects which appear in the display area 92, such as text, the horizontal and vertical axis, cursors, and the waveform. The waveform object is set up to specify, in pixels, the physical location in the display area 92 where the waveform is to be displayed. Other fields are then used to specify how the waveform should be displayed within that portion of the display area 92. These other fields are used to map the world coordinates to display coordinates by specifying which amplitudes in waveform counts are to be mapped to the top and bottom edges, and which distances in WFM_X_ UNITS are to be mapped to the left and right edges of the display area 92 in which the waveform is to appear.

Figure 4:
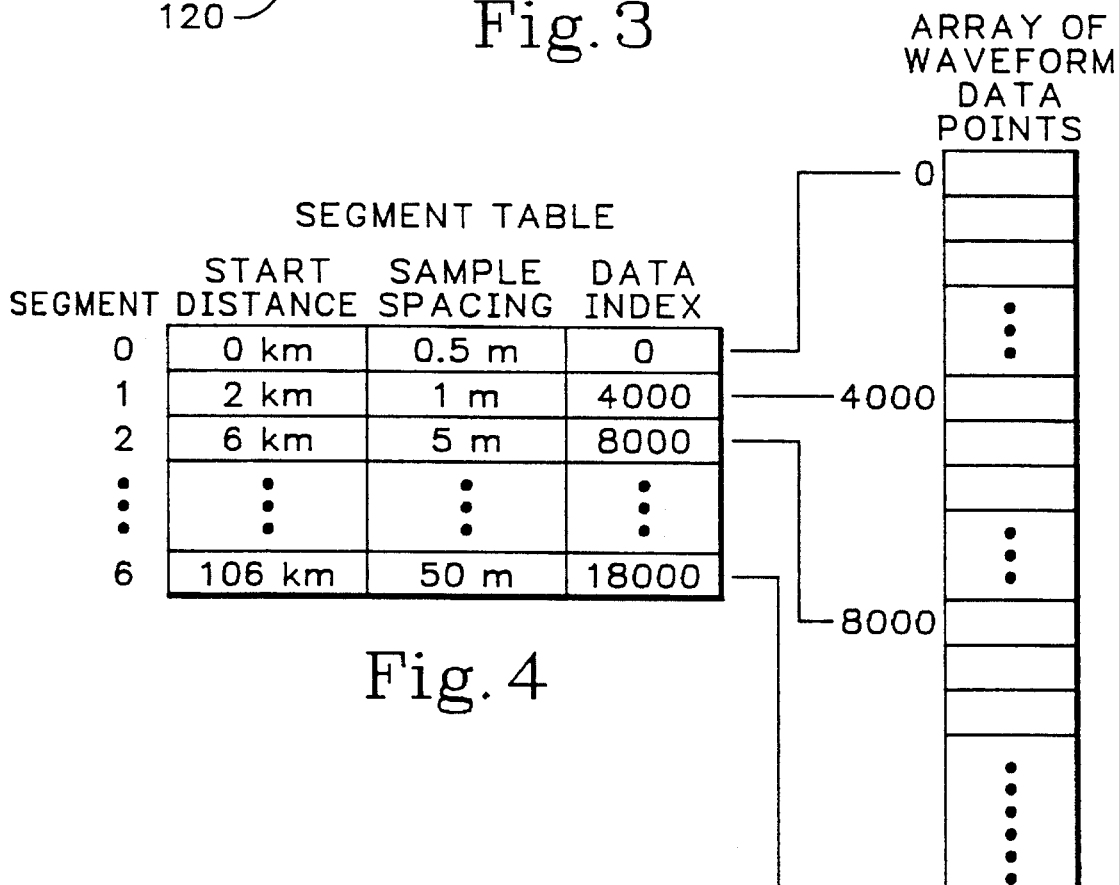
FIG. 4 is a representation of the waveform segment table and the array of waveform data points stored in memory in the optical time domain reflectometer using the method for displaying wavform segments having different sample densities as a waveform trace according to the present invention.

The acquisition and display of waveform data having waveform segments with the segments acquired using different pulse widths, sample spacings and starting distances is set-up using the user interface 80. Depressing the set-up softkey button 82 allows a user to define the type acquisition mode to use, such as IntelliTrace™ mode, auto mode or manual mode, and the test parameters, such as 850 nm multimode test or 1310 nm singlemode test. The acquisition of waveform data having waveform segments is initiated when the start/stop button 90 is pushed. The system processor 50 accesses routines from ROM 52 for passing parameter information, such as pulsewidth, sample spacing and starting distance, over the serial link 46 to the controller 38 in the DAS 12. The controller 38 accesses routines stored in ROM 42 for acquiring the first waveform segment. As the data points are acquired and averaged for the waveform segment, they are stored in a buffer in RAM 44. Once the acquisition of the first waveform segment is complete, the waveform segment data is passed back to the main processor over the serial link 46. The waveform segment data received from the DAS 14 is stored in a buffer in RAM 54. The main processor 50 calls a event detection routine, such as described in U.S. Pat. No. 5,365,328 titled "Locating the Position of an Event in Acquired Digital Data at Sub-Sample Spacing" and assigned to the assignees of the present invention, to determine the presence of and to characterize any event in the waveform segment data. This routine also determines the starting point for the next waveform segment based on the location of events in the waveform segment data and the location where the waveform segment data falls into the instrument noise floor. The routine for determining the starting point for the next waveform segment backs up a fixed distance to allow for overlap of the next waveform segment. The data is scaled further back until a the data is out of the noise floor and not on an event. This information is passed over the serial link 46 to the DAS 12, along with the pulsewidth and sample spacing parameters for the next waveform segment acquisition. The processor 50 calls another routine to transfer the data stored in the buffer of RAM 54 to a contiguous block of memory in RAM 54 as an array of waveform data points. As each data point of the first waveform segment is read from the buffer it is scaled so as to display the maximum amplitude values in the overview viewport. A segment table, also in RAM 54 and representatively shown in FIG. 4, is generated and updated with the start distance for the waveform segment, the sample spacing for the segment and an index into the array of waveform data related to distance. Since the array of waveform data is stored in a contiguous block of memory, the index into the array of waveform data is a sequential set of integers starting at a zero value and increasing by one for each waveform data point. Further, because the segment table includes the starting distance and the sample spacing for each acquired waveform segment, each index into the array is related to distance. For example, in the representative segment table of FIG. 5, the data index for a distance of 3000 meters falls within the second segment. The second segment has a starting distance of 2000 meters and a data index of 4000 based in the assumption that the first segment contains 4000 data point acquired with a 0.5 meter sample spacing. Subtracting 3000 meters from the starting distance of the second segment of 2000 meters produces a result of 1000 meters. The 1000 meter result is divided by the one meter sample spacing of the second waveform segment producing an result of 1000. Adding this result to the data index of 4000 for the start of the waveform segment gives a value of 5000, which is the index into the array of waveform data associated with the distance of 3000 meters. In the implementation of the present invention, the starting distances of the various waveform segments will vary as a function a number of conditions, such as the optical loss in the fiber under test, the optical power level of the interrogating laser pulses, the dynamic range of the optical receiver in the OTDR, and the like.

Once the data from the first waveform segment acquisition is stored in the array of waveform data in RAM 54, it is mapped into the video frame buffer of RAM 54 as a bit map array, which is accessed by the display controller 56 and displayed as a display trace 94 in the display area 92 of display device 60. The process for mapping the waveform data includes establishing a horizontal pixel skip value and a horizontal distance skip value. A horizontal distance per pixel value for the display area 92 is calculated as a function of dividing the distance between the active viewport start distance and the active viewport end distance by the number of horizontal pixels in the display area 92. The active viewport will be either the overview viewport 124 or the expansion viewport 126. If the horizontal distance value is less than the sample spacing of the waveform segment being mapped, a new horizontal pixel skip value is calculated as a function of dividing the sample spacing of the waveform segment by the horizontal distance per pixel value and the horizontal distance skip value is set equal to sample spacing of the waveform segment. The horizontal pixels are mapped to distances by setting an initial pixel count to zero and sequentially adding the horizontal pixel skip value to the pervious pixel count and setting an initial horizontal distance value to the active viewport start distance and sequentially adding the horizontal distance skip value to the previous horizontal distance value. The distance values for the horizontal pixels are correlated to the amplitude values of the data points of the waveform segment using the indexes of the data points related to distance. The amplitude values are then mapped into the bit map array of the video buffer to the appropriate vertical pixels associated with the horizontal pixels. The display controller 56 reads the video frame buffer containing the bit map array and displays the first waveform segment as the display trace 94 in the display area 92.

Terminating the mapping and displaying process after the last data point in the array of waveform data points is mapped to a horizontal pixel location improves the overall speed of the OTDR. The distance of the last data point in the array of waveform data, which is the last data point of one of the waveform segments, is determined as a function of the index into the array of data points. As was previously described, any index into the array of waveform data points can be related to a distance by the starting distance of the waveform segment containing the data point and the sample spacing for the waveform segment. The distance for the last data point in the array of waveform data is stored and compared to the incrementing horizontal pixel distances. When the horizontal pixel distance is greater than the distance value of the last data point in the array of waveform data, the mapping of data points into the video display buffer is terminated and the buffer is read by the display controller 56. A further improvement in the speed of the OTDR is possible by comparing the start distance of the first waveform segment to the horizontal pixel distance and incrementing the horizontal pixel count and the horizontal value without performing any of the waveform data mapping process when the horizontal pixel distance is less than the starting distance of the first waveform segment.

Once the data from the first waveform segment acquisition is stored in the array of waveform data in RAM 54, the DAS 12 starts to acquire the data points for the second waveform segment. Once this acquisition is completed, the waveform segment data is transferred to the main processor vie data link 46. The data from the acquisition of the second waveform segment is stored in the RAM 54 buffer and examined for events and noise floor as the previous waveform segment. The starting distance for the next waveform segment is determined and passed to the DAS 12 along with the pulsewidth and sample spacing parameters for the next acquisition. A scaling factor is determined for the data points of the second waveform segment for matching the data at the start of the second waveform segment with the data at the end of the first waveform segment. The scaling factor is determined by the averages of the overlapping points at the splice location on the two waveform segments. The amount the second segment is vertically shifted is equal to the difference in the averages. As previously mentioned, the start distance for the second waveform segment falls within the range of the first waveform segment. The data points of the second waveform segment stored in the buffer of RAM 54 write over some of the data points of the first waveform segment as the second waveform segment data is written into the array of waveform data stored in the contiguous block of memory in RAM 54. The segment table in RAM 54 is updated with the start distance, sample spacing and the indexes into the array of waveform data for the second waveform segment. The mapping process is repeated for each of the subsequent waveform segments. As the distance values for the horizontal pixels extend beyond the starting distance of the subsequent waveform segments, the various mapping values are redefined for each segment. Each time the data points for a waveform segment are added to the array of waveform data, the bit map array in the video frame buffer is updated and the display controller 56 accesses the buffer to produce an updated waveform trace 94 of the waveform data on the display device 60. The acquisition of waveform segments continues until all segment are acquired, examined, scaled and stored in the array of waveform data in the contiguous block of memory in RAM 54.

Various alternatives may be included as part of the acquisition of waveform segments described above. For example, the acquisition, examination, storage of a first waveform segment is completed prior to the acquisition of a second waveform segment. This serial process may be replaced with a parallel process where the first waveform segment is acquired and passed to the main processor where a quick determination of the starting distance for the second waveform segment is determined and passed back to the DAS along with the pulsewidth and the sample spacing. The DAS 12 starts the acquisition of the second waveform segment while the main processor examines the first waveform segment for events, scales the data points of the first waveform segment, stores the data in the contiguous block of memory and updates the waveform segment table in RAM 54, maps the data into the video frame buffer and initiates the display process.

Figure 5:
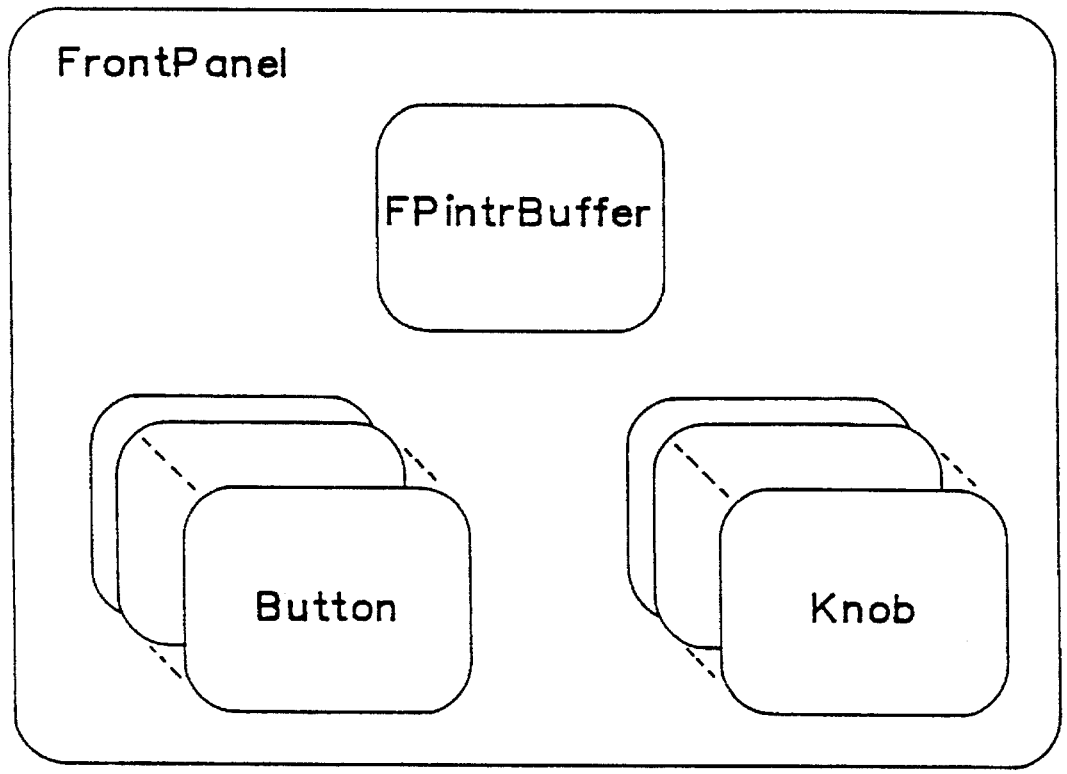
FIGS. 5–7 illustrate the organization of software objects in the optical time domain reflectometer using the method for displaying wavform segments having different sample densities as a waveform trace according to the present invention.
Figure 6:
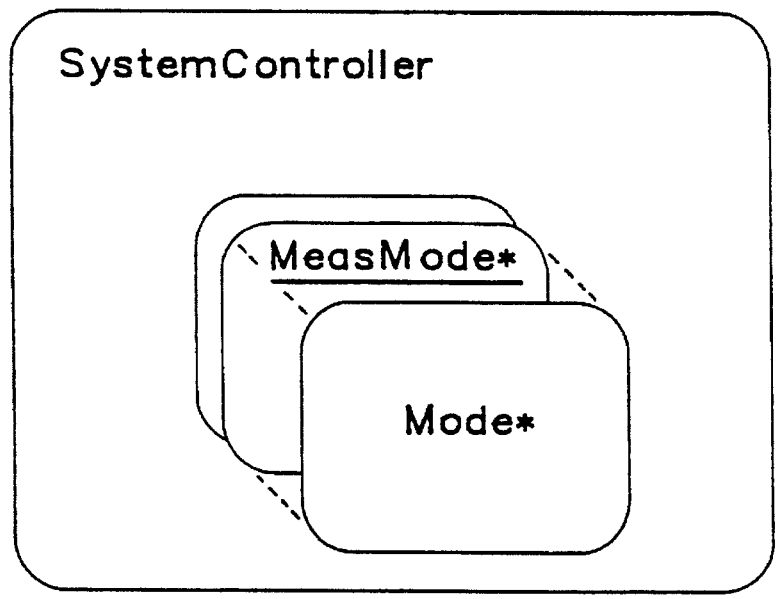
Figure 7:
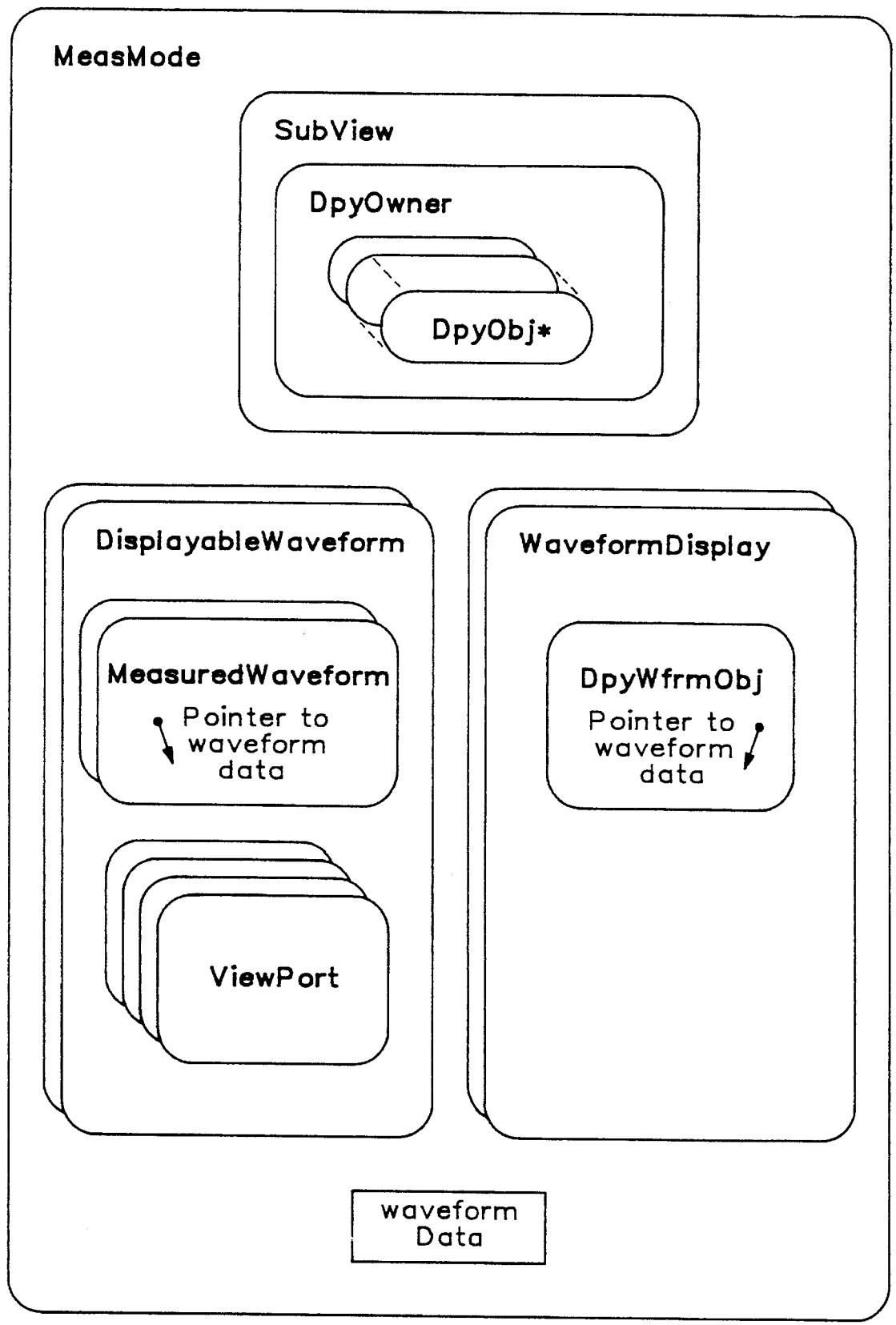

FIGS. 5, 6 and 7 show structural diagrams on how the more complex objects used in performing the acquisition and display of waveform segments having different pulsewidths and sample spacings according to the present invention can be built by combining other objects. Objects having the same behavior may be implemented through a class hierarchy where the behavior from a base class is used by an object in a derived class or the object itself may be defined for implementing all of its behavior. The objects are described below as though they implement all of their behavior irrespective of whether a particular behavior was originally implemented through a class hierarchy. One having ordinary skill in object oriented programming languages will be able to derive their own class hierarchy from the description of the objects.

SYSTEM OBJECTS

FrontPanel

The single instance of this class maintains a list of Button and Knob objects (one for each occurrence on the front panel interface 80), a FPIntrBuffer queue for pending front panel events (stored by the EvtProc object process), and a pointer to a process to be signaled when the front panel interface 80 SysEventRec is ready for consumption. This process is the SystemController process object. This object is also responsible for reading from memory locations containing front panel interface hardware status.

EvtProc

The single instance of this class interprets the key codes coming over the serial link from the power supply board and sets the front panel interface hardware status memory locations with button down, button up, and button being held count values and calls doFPinterrupt().

FPIntrBuffer

An instance of this class acts as a queue which stores information regarding the key code from the from panel. The information stored includes the type of key code (e.g. button down, or knob turned), and which button or knob generated the key code.

Button

For each front panel button there is an instance of this class which maintains the button's status. This status includes the type of button (e.g. whether to report when the button is pressed, or report when the button is pressed and again alter it has been held for a length of time, acceleration to be used for the button (a list of multipliers to be used based on the time between key codes for that button), or report when it is pressed and again when it is released, etc.), and the state of the button (e.g. down, up, being held, etc.).

Knob

For each front panel knob there is an instance of this class which maintains the knob's status. The status includes the type of knob (one that reports when it is turned or one that also reports after it has been idle for a length of time), acceleration to be used for the knob (a list of multipliers to be used based on the time between key codes for that knob), and the state of the knob (how many clicks the knob has turned since the last time a system event was generated for the knob).

SysEventRec

Each instance of this class represents a system event. One of its members indicates the type of the event. These events may represent such things as BUTTON-DOWN, BUTTON-UP, BUTTON-HELD, BUTTON-REPEAT, KNOB-TURNED, KNOB-IDLE, WAVEFORM-UPDATE among others. For the case of a button or knob event another member indicates which button or knob is involved, and for knob events there is a member which indicates how far the knob is turned (positive is clockwise).

SystemController

The one instance of this class is the central controller for dispatching events to the appropriate objects. These events are most commonly from panel events, but can be other events sent from other processes such as acquisition events when acquired waveform segments are ready for processing and display. It maintains a list of pointers to the major modes in the system of which the MeasMode object is one.

MeasMode

The one instance of this class is the main controller for the measurement subsystem of the OTDR software. It creates and maintains a DisplayableWaveform and WaveformDisplay object pair for the displayed waveform. When an acquisition is being performed, the newly acquired data is stored in the current waveform. It creates a SubView object which specifies the region of the display area in which the waveform is to be displayed. It also creates and maintains the objects which are responsible for performing and displaying the different types of measurements which are performed on the OTDR data. It catches and interprets the system events (SysEventRec) which are passed down from the SystemController and which effect the cursors, view ports, and waveform.

AcqProc

The one instance of this class is the main controller for the acquisition subsystem of the OTDR software. It schedules the acquisition and analysis of the individual segments that make up the segmented waveform. It communicates with the TfsAcq object to acquire each waveform segment. It then takes the waveform segment data and splices it onto any previous segments that have been acquired and places the resulting waveform into waveform data array pointed to by the current MeasuredWaveform object. It then sends a WAVEFORM-UPDATE event to the system controller 50 and signals MeasProc object to analyze the waveform segment data and determine the correct acquisition parameters for acquiring the next data segment (if needed).

TfsAcq

The one instance of this class serves as a wrapper around the acquisition hardware. Upon receiving a request for a data segment, it sends the appropriate commands to the hardware. When the acquisition is complete, it receives the data and places it into a waveform data buffer contained in the MeasProc object.

MeasProc The one instance of this class performs analysis of the acquired waveform data that is stored in its waveform data buffer. It locates events in the waveform segment data and determines appropriate parameters for the next waveform segment acquisition.

DisplayableWaveform

The one instance of this class represents the displayed waveform. Each instance contains two MeasuredWaveform objects; one for normal density data and one for high density data. It also contains four ViewPort objects; one for the clipping viewport 122, one for the overview viewport 124, one for the expansion viewport 126, and one to keep track of the normal density expansion when viewing high density data (this is necessary when selecting between a cursor that is on high density data and one that is on normal density data). This object also has the responsibility of coordinating the behaviors of its members. For example, it knows that if the active cursor is scrolled out of the display area 92, then the active viewport must be moved to enclose the active cursor again, or that if the expansion goes to the limit of normal density data, then the high density data needs to be displayed (if it is available). The high density data is not active during the acquisition and display of waveform segments.

MeasuredWaveform

There is an instance of this class for each waveform segment stored in the OTDR. It stores waveform scaling information as well as information regarding the acquisition used to acquire its data (pulse width settings, sample spacing, etc.). The scaling indicates the waveform horizontal location in world coordinates. Its information includes the size of the array of waveform data and the segment table containing the start distance for each segment within the array of waveform data (stored as a number of WFM_X_

UNITS) which is the distance of the first data point in each waveform segment, and a scale in WFM_X_UNITS for each segment, which represents the sample spacing for each waveform segment and an index into the array of waveform data for each segment, which represents the beginning index for the segment. For the waveform segments, the offset represents the start distance of the various wavform segments and the scale represents the sample spacing of the various waveform segments. Each data sample represents an amplitude in WFM_Y_UNITS. In the preferred embodiment a WFM_X_UNIT is 0.5 mm in world coordinates and represents the minimum distance resolution possible for the OTDR. A WFM_Y_UNIT represents the minimum amplitude resolution possible in the OTDR in word coordinates, which is based on the output of the acquisition hardware. In the preferred embodiment there are approximately 573 WFM_Y_UNITS per dB.

ViewPort

Each instance of this class represents an area in world coordinates. The minimum and maximum distance (left and right boundaries) are stored in terms of WFM_X_UNITS, and the minimum and maximum amplitude (the top and bottom boundaries) are stored in terms of WFM_Y_UNITS. This object also has member functions which define behaviors such as centering the viewport vertically or horizontally around a given amplitude or distance, changing the height or width of the viewport such that a given amplitude or distance maintains its relative position within the area defined by the viewport (e.g. the width is enlarged by adjusting the min and max distances such that a given distance ends up the, same 27% from the left edge as it started from), and shifting the viewport enough in the vertical or horizontal direction so that a given amplitude or distance will fall within the boundaries of the viewport.

CursorModel

Each instance of this class represents one of the cursors seen on the display. The cursors use a distance member to represent the distance (in WFM_X_UNITS) where the cursor lies in the horizontal dimension, and an amplitude member to represent the amplitude of the waveform (in WFM_Y_UNITS) at the distance of the cursor (to avoid repeatedly looking up the amplitude in the waveform data set).

SubView

Each instance of this class maintains a list of display objects which are displayed together as a group and defines the area in which that group of objects is to be displayed through the use of a DpyOwner object.

WaveformDisplay

An instance of this class exists for the current waveform. It maintains a DpyWfrmObj, two DpyCursorObjs (one for each cursor), and a DpyExpWindObj which are the display object presentations used in displaying the waveform. It is notified when a change occurs in its companion DisplayableWaveform object (or its members) and then makes sure that its member objects are up to date with those of the DisplayableWaveform object.

DpyCursorObj

Each instance of this class represents a cursor in the display area 92. One of its members points to the DpyWfrmObj on which the cursor is to be displayed. Its location is specified by giving its location on the waveform as a data point index (the display does mapping between data points and pixels in the process of displaying the waveform related objects).

DpyWfrmObj

Each instance of this class represents a waveform data set. This object differs from a MeasuredWaveform object in that it does not contain some of the measurement and acquisition information stored in the MeasuredWaveform object and contains a pointer that points to the data array of the MeasuredWaveform object. The DpyWfrmObj also contains additional scaling information used by the display process to determine which portion of the waveform object is to be displayed within the waveform area in the display area 92 of the display device 60. Each instance of this object includes members which specify where the object is to be displayed within its SubView as the location of the upper left corner and its width and height (in pixels) relative to the location of the SubView's upper left corner. The scaling of the waveform is then determined according to members which specify the distances (in WFM_X_UNITS) which correspond to (or are to "line up with") the left and right edges of the waveform object boundary. Another member stores the size of the data set so that only legal indexes are used in accessing and displaying the data set values. The vertical dimension is similarly scaled via members which specify the amplitudes (in WFM_Y_UNITS) which correspond to the top and bottom of the waveform object boundary.

DpyExpWindObj

Each instance of this class represents an expansion window 110 on the display. This object differs from a ViewPort object in that it resides in memory and holds its boundary information in a form that can be interpreted by the display process. One of its members points to the DpyWfrmObj on which it is to be displayed. Other members specify where its center point is located on the waveform (a data points index and an amplitude in WFM_Y_UNITS), and its width and height (in data points and WFM_Y_UNITS).

DpyOwner

Each instance of this class maintains a list of pointers to display objects which are displayed together as a group. The display objects in the DpyOwner specify their position relative to that of the DpyOwner. In addition the DpyOwner can also be used to specify behavior common to all objects in the group (e.g. colors).

DpyList

The one instance of this class maintains a list of pointers to all visible DpyOwner objects within the OTDR, and therefore points to all visible display objects (as each display object must belong to a DpyOwner). This list is passed to the display process whenever display commands are issued. In those instances where the entire list is not displayed, the list is used to check for overlapping objects. The members of this list are sorted according to their priority (the display process displays its members in order, so the lower priority objects are listed first).

GracieDev

The one instance of this class represents the display process of the instrument controller 50. The instrument controller 50 makes requests of this object to draw or erase display objects. This object then makes use of the Mailman object and MailMessage objects to carry out the request.

MailMan

The one instance of this class handles the low level communication between the system control process and the display process. It sends signals to the display process when display commands are issued, and responds to display process interrupts when the display process has finished a requested display command.

MailMessage

Instances of this class are used to pass display commands to the display process. There are two special instances (an in-box and an out-box) which handle communications between the instrument process and the display process. The members of this object are used to specify the DpyList, the type of display command to be performed (e.g. draw, erase, or some other special types), and the object on which to perform the display operation (for the cases where the entire display list is not being drawn). Other status information and the results of the display command are also stored in this object.

OBJECT COMMUNICATION

Figure 8:
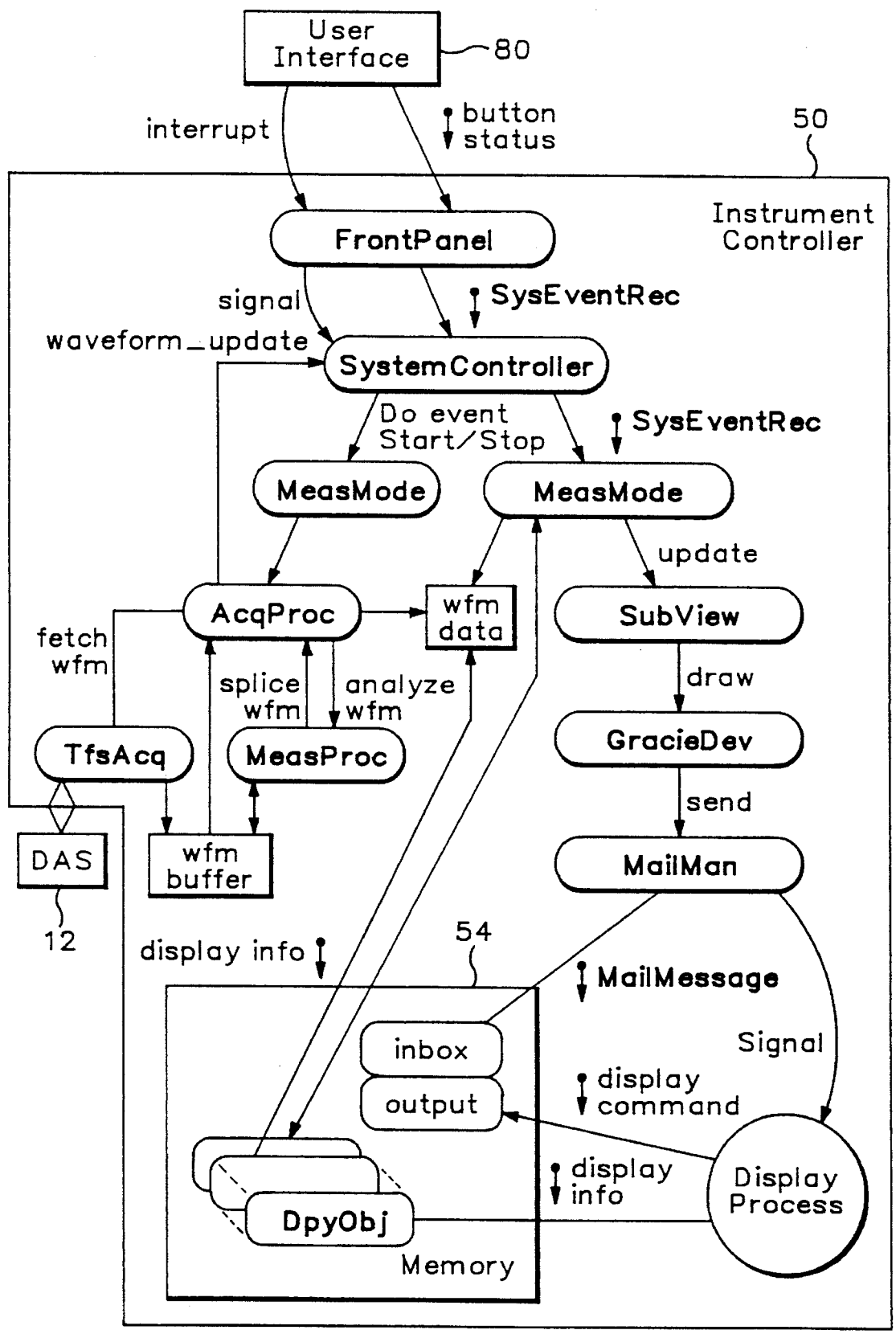

FIG. 8 is a representation of the relationship between the hardware elements and the communications between objects. The solid circles with arrows represent information being passed between objects or between objects and the display process and the arrows between objects represent messages from one object to another requesting that a task be performed. This figure in conjunction with the above described object behaviors and the accompanying description of the communications between objects associated with FIGS. 9–25 implement the method for displaying wavform data having at least two waveform segments as a waveform trace on a display device according to the present invention.

Figure 9:
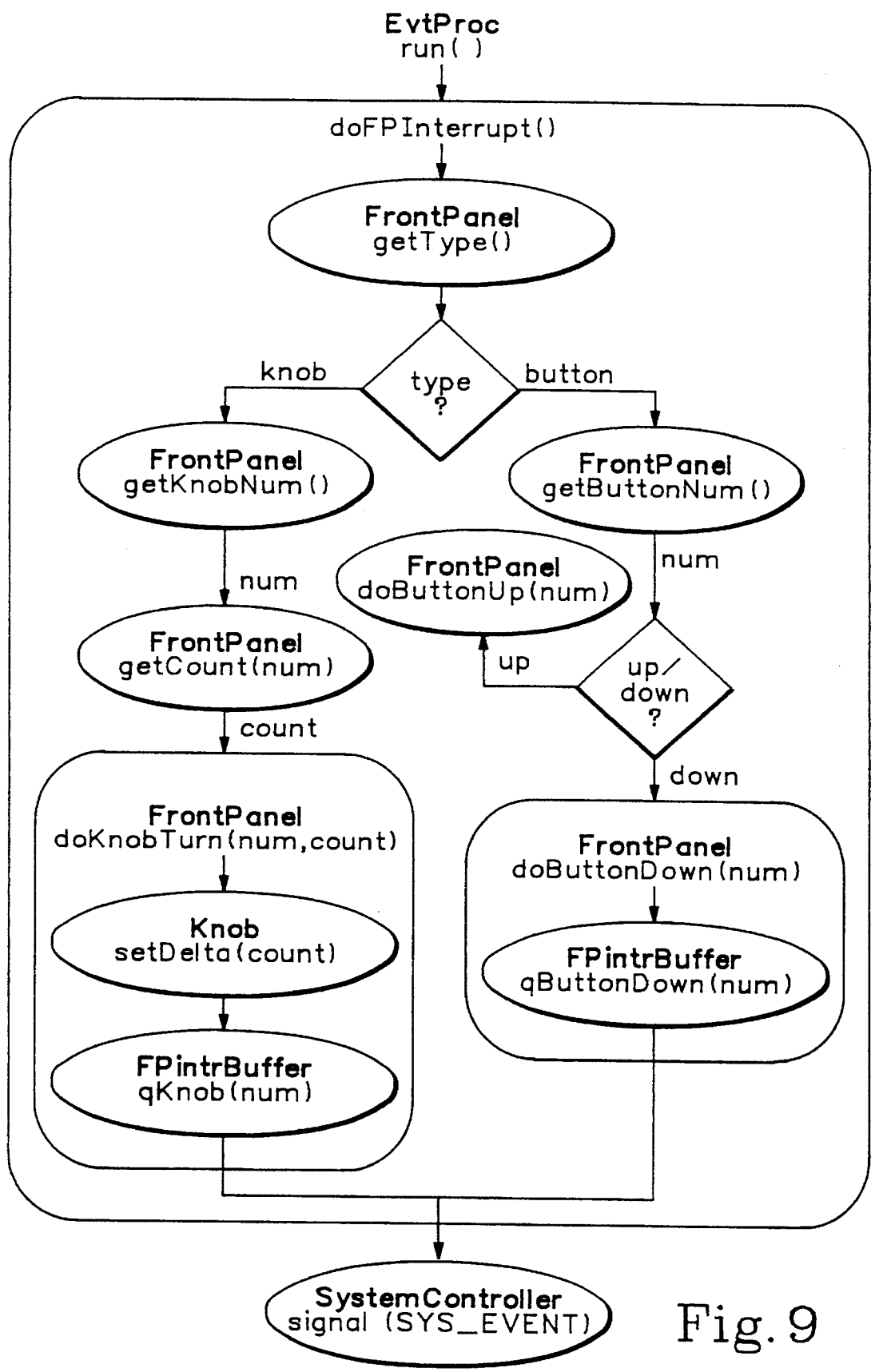

The sequence of events shown in FIG. 9 occur within the context of the EvtProc process object. The routines getType(), getKnobNum(), getCount(), and getButtonNum() read the memory locations established by EvtProc and return the appropriate status information. The FrontPanel routine doKnob Turn() updates the knob count of the appropriate Knob object according to the new delta value from the front panel. The Knob's setDelta() routine also records the time of the event. Both this routine and the doButtonDown() routine queue up the occurrence of the event in the FPIntrBuffer object, and then sends a signal to the SystemController object causing its run() loop to stop waiting. The SystemController, which represents a separate process, responds to the signal by checking back to the FrontPanel object to see if there are any events pending.

Figure 10:
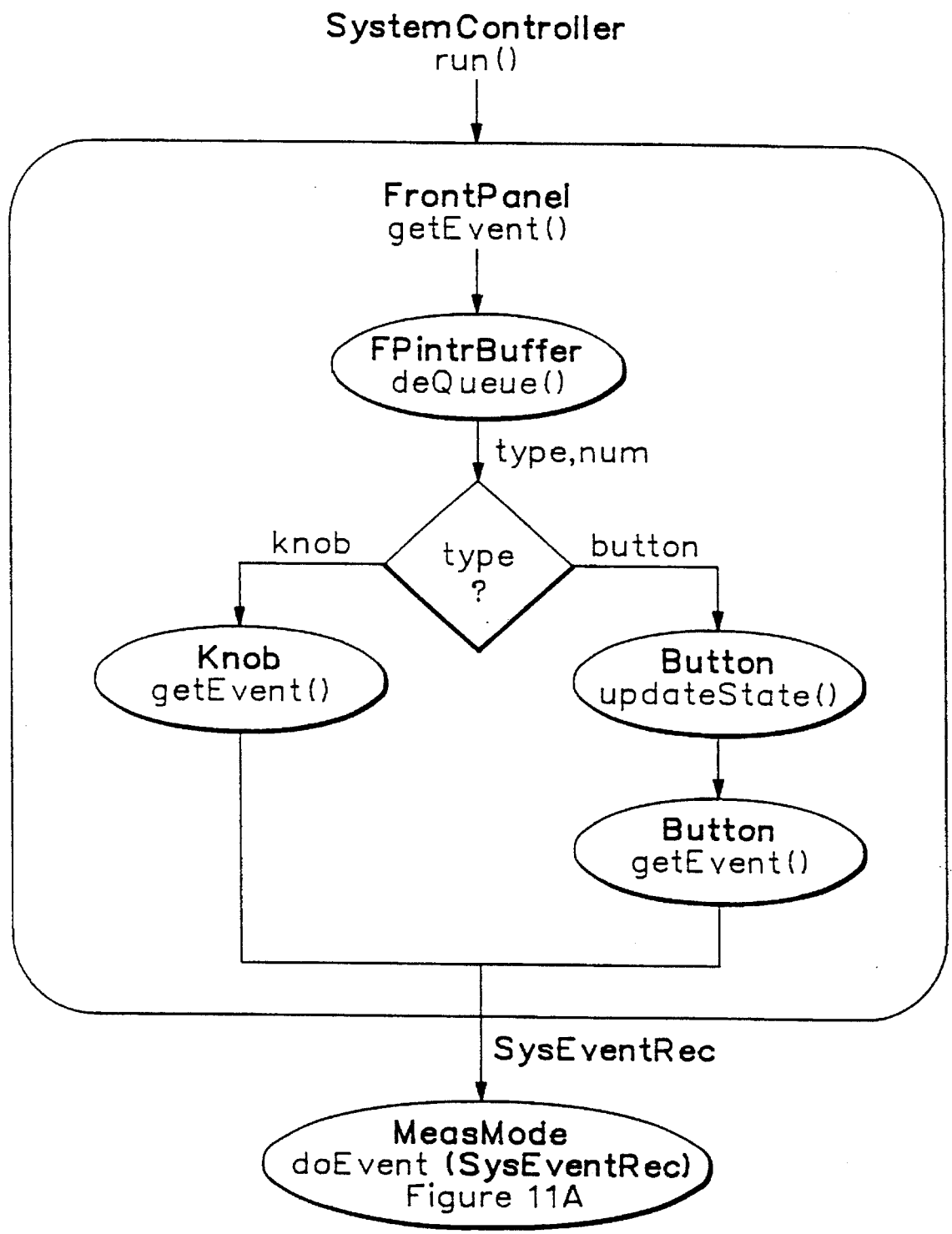

The sequence of events shown in FIG. 10 and subsequent figures relate to the update and display process, which occurs within the context of the SystemController process. As part of the normal processing loop, which runs continuously, or in response to a signal from the front panel, the FrontPanel object is poled for events. If an event exists in the FPIntrBuffer then it is removed and returned. If not, an event may be generated if it is determined that one of the knobs or buttons has changed state without an interrupt being generated. This occurs for such events as KNOB_IDLE, and BUTTON_HELD, which occur as a result of the passage of time. Depending on its type, a request to the appropriate Knob or Button object is made to generate a SysEventRec for the front panel event. In the case of a button event, the Button is first told to update its state, which includes recording the time of any event. Each Button object maintains its own state in software. The SystemController then passes the event to MeasMode object, which is one of several modes available in the OTDR. As is shown in FIG. 8 the system event passed to the MeasMode object initiates the acquisition of a waveform segment; in response to the start/stop button or updates the display area 92 of the display device 60. MeasMode communicates with AcqProc which schedules the acquisition and analysis of the individual segments that make up the segmented waveform. It communicates with the TfsAcq object to acquire each waveform segment. It then takes the waveform segment data and splices it onto any previous segments that have been acquired and places the resulting waveform into waveform data array pointed to by the current MeasuredWaveform object. It then sends a WAVEFORM-UPDATE event to the system controller 50 and signals MeasProc object to analyze the waveform segment data and determine the correct acquisition parameters for acquiring the next data segment (if needed). TfsAcq sends the appropriate commands to the hardware upon receiving a request for a data segment AcqProc. When the acquisition is complete, it receives the data and places it into a waveform data buffer contained in the MeasProc object. MeasProc performs analysis of the acquired waveform data that is stored in its waveform data buffer. It locates events in the waveform segment data and determines appropriate parameters for the next waveform segment acquisition.

Figure 11A:
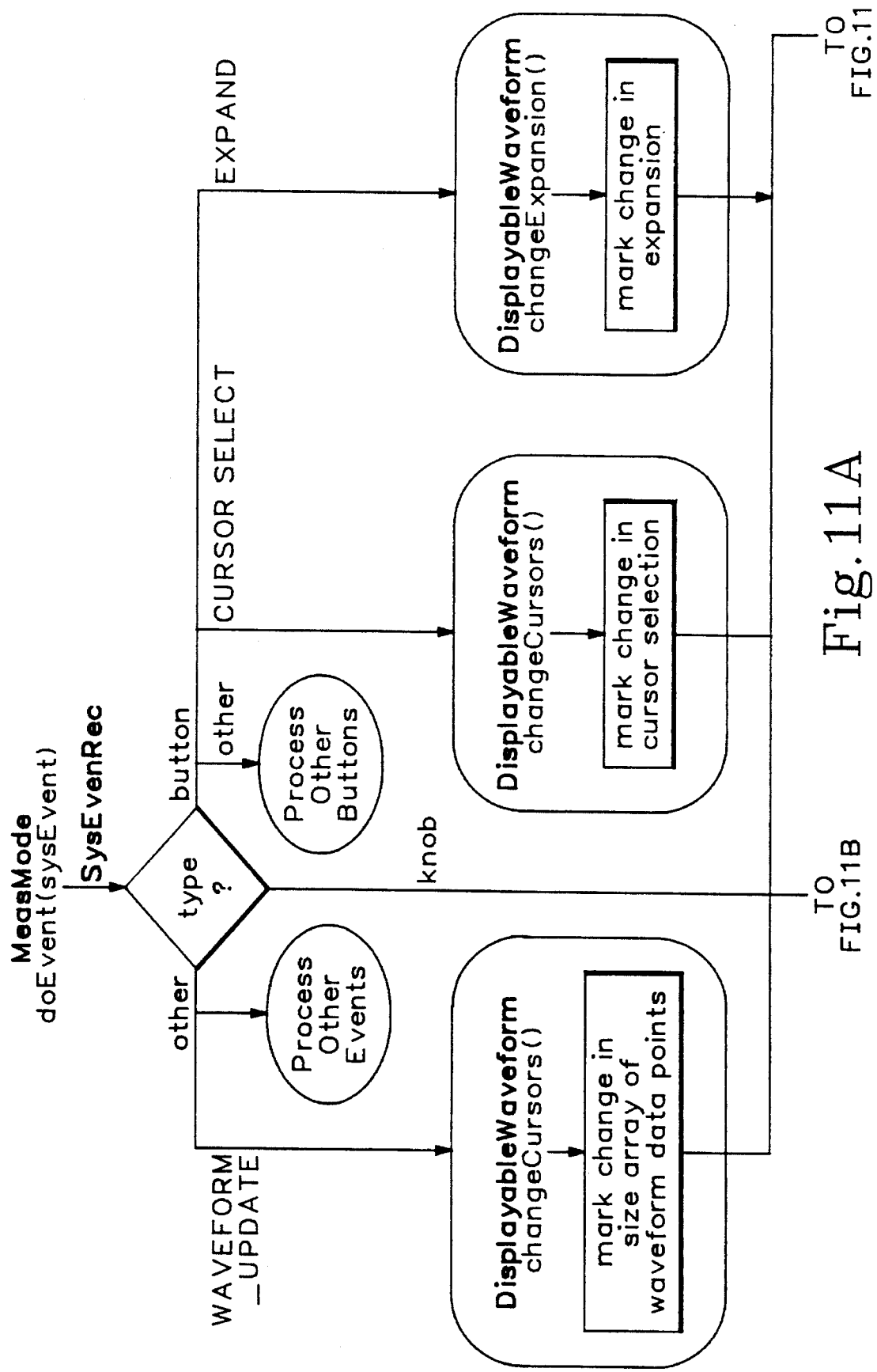

FIG. 11 shows the response of MeasMode to the system event, which it identifies as being one of the buttons or knobs it is to respond to when it is active. Only the response to those buttons and knobs which affect how the active waveform is viewed are shown. These are the CURSOR SELECT and EXPAND softkeys 82, and the CURSOR CONTROL, HORIZONTAL WINDOW SIZE, VERTICAL WINDOW SIZE, WAVEFORM VERTICAL POSITION, and WAVEFORM HORIZONTAL POSITION arrow buttons 86–89.

Figure 12:
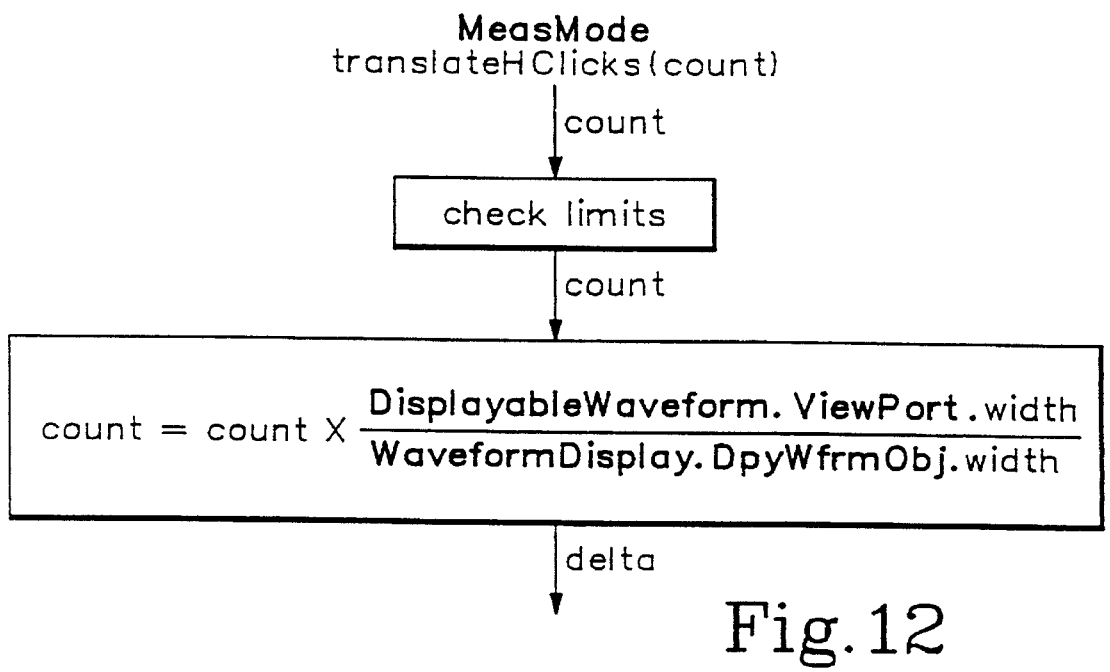
Figure 13:
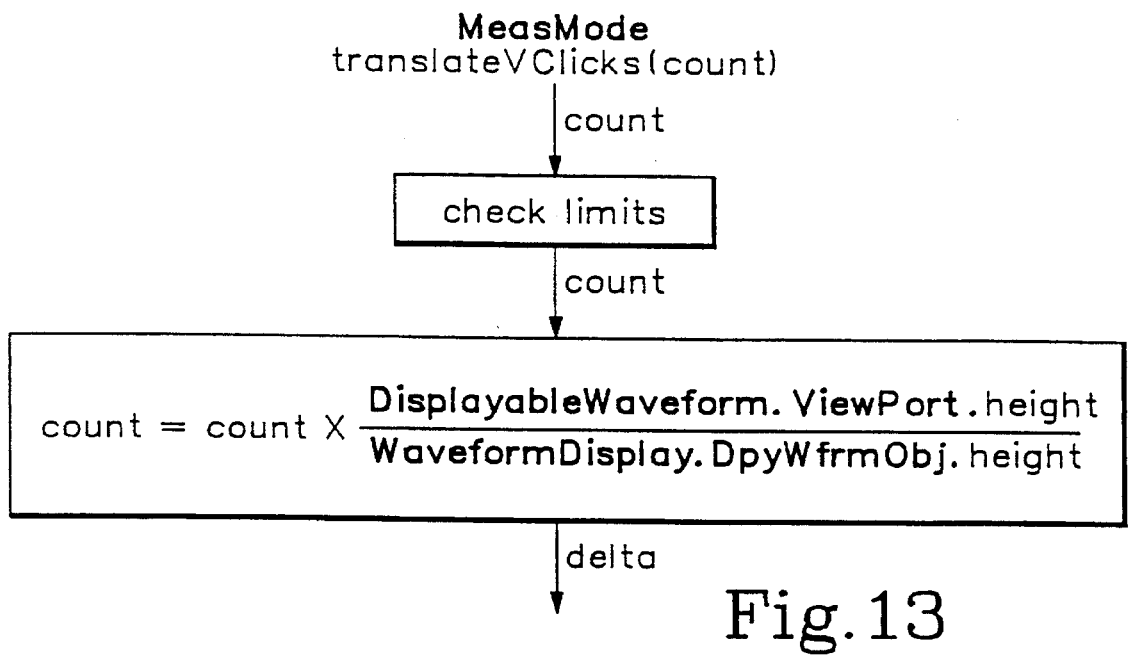

FIGS. 12 and 13 show how the count received from the arrow buttons or knobs is interpreted as a change in pixel units. Limits are checked to ensure that a small number of clicks result in at least one pixel move and that knob acceleration doesn't cause an ungainly jump on the part of the object being manipulated. The translation is done in the horizontal direction by comparing the current width in WFM_X_UNITS of the active ViewPort object with the width of the DpyWfrmObj, which defines the width in pixels of the display area in which the waveform is displayed. Which ViewPort object is active depends on the state of the instrument, i.e. the expanded viewport in the display area 92 or the overview viewport, etc. Likewise, the translation is done in the vertical direction by comparing the current height in WFM_Y_UNITS of the active Viewport object with height of the DpyWfrmObj, which defines the height in pixels of the display area in which the waveform is displayed.

Figure 17:
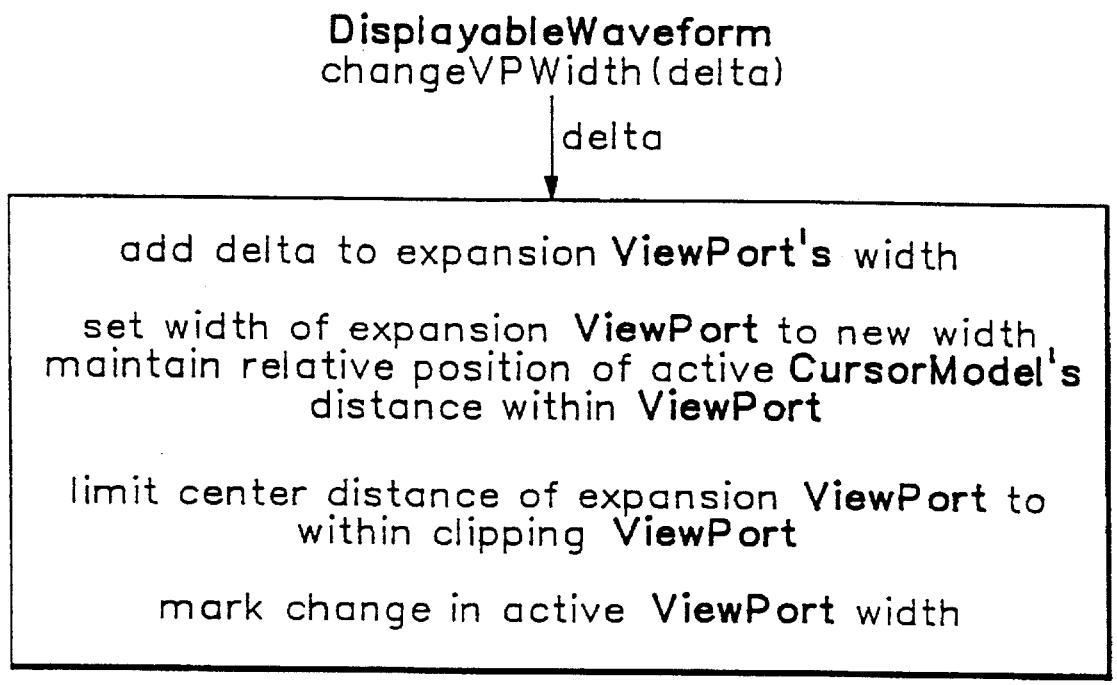
Figure 18:
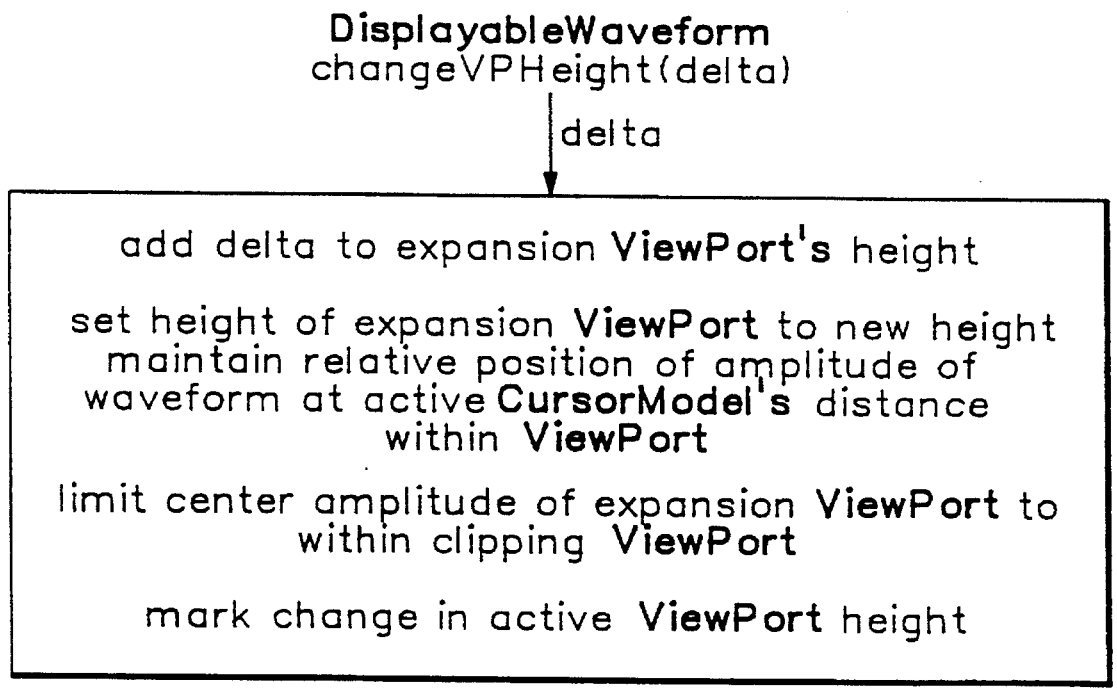
Figure 19:
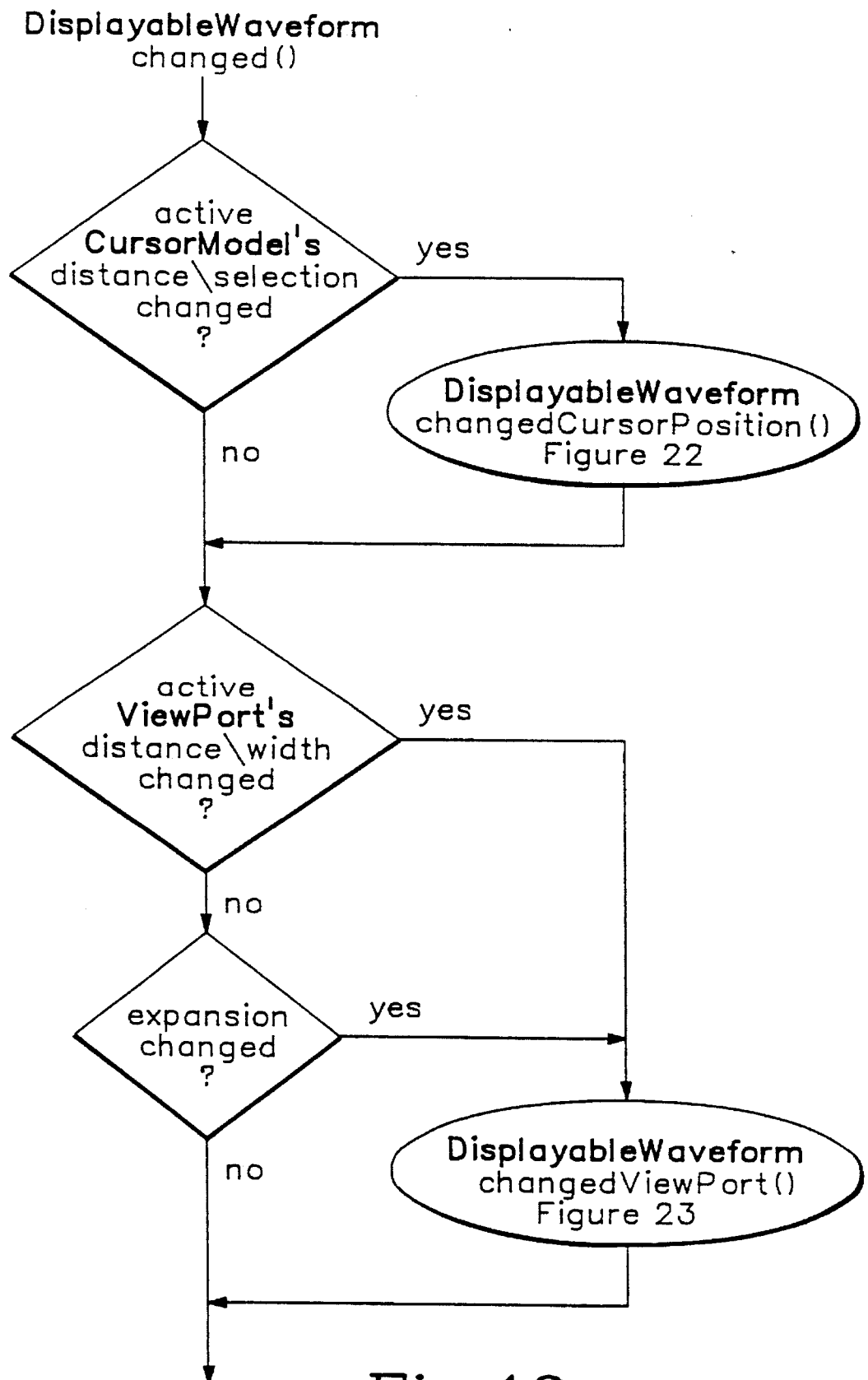
Figure 20:
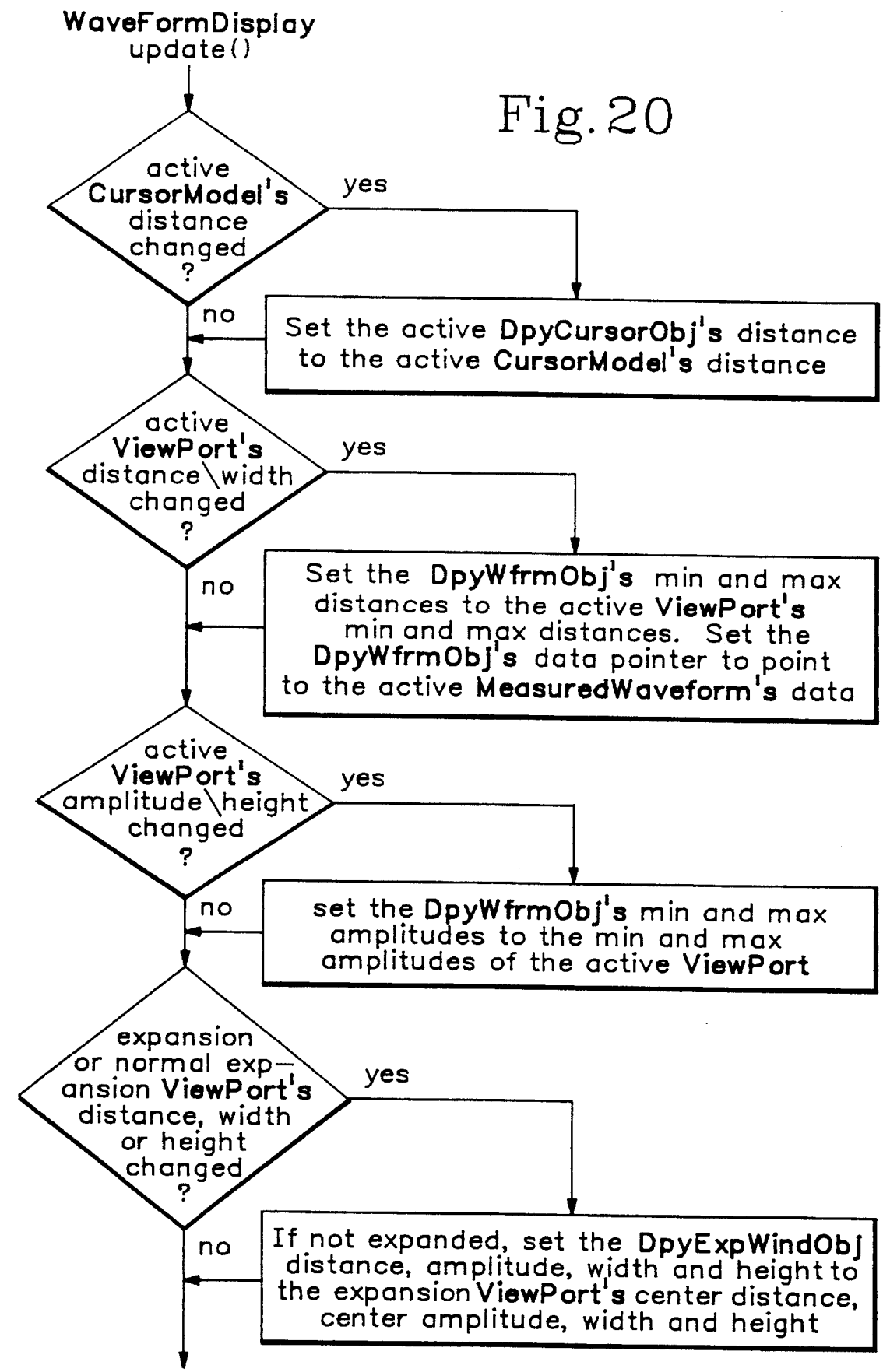

In FIGS. 14–18 the object directly affected by the front panel event is updated according to the event. For example, the active CursorModel's distance is changed in response to a CURSOR knob event. The change is marked so that later processing can make the appropriate response to the change, such as moving the active Viewport object if the cursor is moved past its edge, or updating the display as is shown in FIGS. 19 and 20. In FIGS. 15 and 16 the center distance and center amplitude of the active Viewport are changed respectively in response to the WAVEFORM HORIZONTAL and VERTICAL POSITION knob events. The respective changes are marked so that later processing can make the appropriate response to the changes. In FIGS. 17 and 18 the width and the height of the expansion Viewport are changed respectively in response to the HORIZONTAL and VERTICAL WINDOW SIZE knob events. Again, these changes are marked so that later processing can make the appropriate response to the changes.

After an object has been changed in response to a front panel event, the changes are checked for possible secondary effects on its companion objects. This is illustrated in FIG. 19, which shows responses to the active cursor being moved or switched with the non-active cursor, the active viewport being moved horizontally or, if in the expanded mode, its width changing, and the expansion switching between overview and expanded modes.

FIG. 20 shows how the shared memory object members of the WaveformDisplay object, the DpyObjs, are updated based on changes made to the DisplayableWaveform objects. The coordinate space of these display objects use the same world amplitude coordinates for its vertical dimension, but uses waveform indexes for its horizontal dimension. The amplitude of the cursor does not need to be set since the cursor is always a fixed height extending from the bottom of the waveform SubView to near the top.

Figure 21:
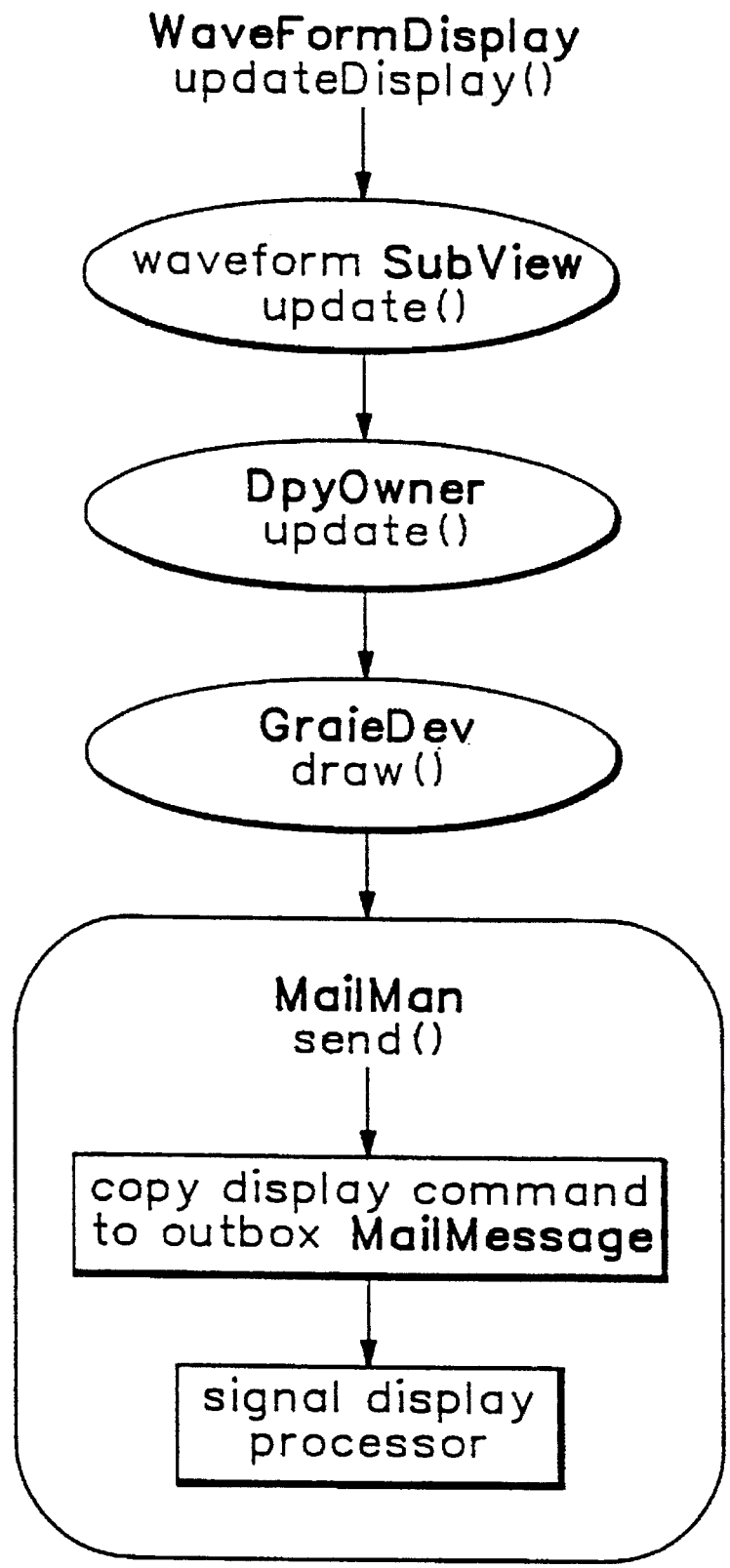

FIG. 21 shows the object communication which results in a display command being sent to the display process. AcqProc send a request (WAVEFORM_UPDATE) to the SystemController to update the display area upon completion of storing the acquired data points from the current waveform acquisition in the array of waveform data points. The SystemController signals a SYS_EVENT to MeasMode to do event (WAVEFORM_UPDATE). MeasMode signal the DisplayableWaveform that a change has occurred and the WaveformDisplay object needs to be updated. The command may represent the drawing or erasing of a single object, all objects in a DpyOwner's list (in a SubView), or all objects in the system (in the DpyList). The type of command depends on how the MailMan send() routine is called. In this case, it is called as a result of telling the waveform SubView object to update, so it is a command that draws the list of objects in a DpyOwner (the one that contains the waveform, expansion window and the distance cursors).

Figure 22:
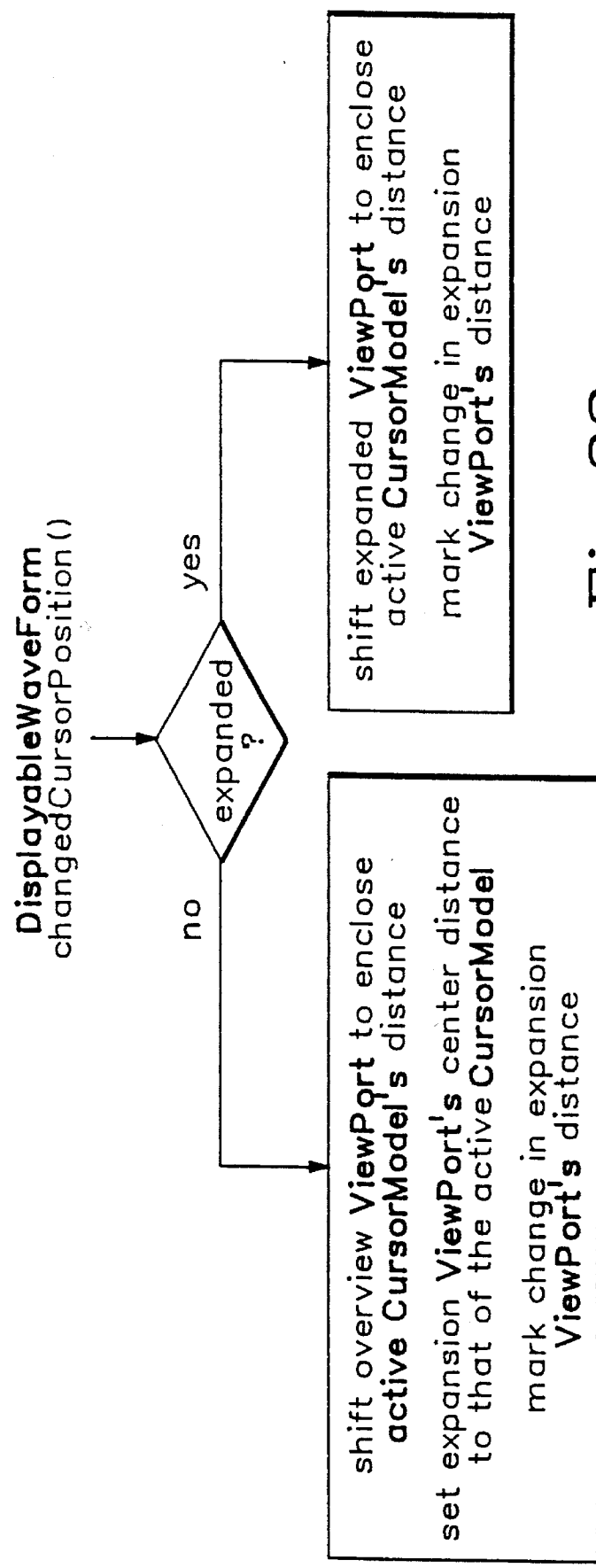
Figure 23:
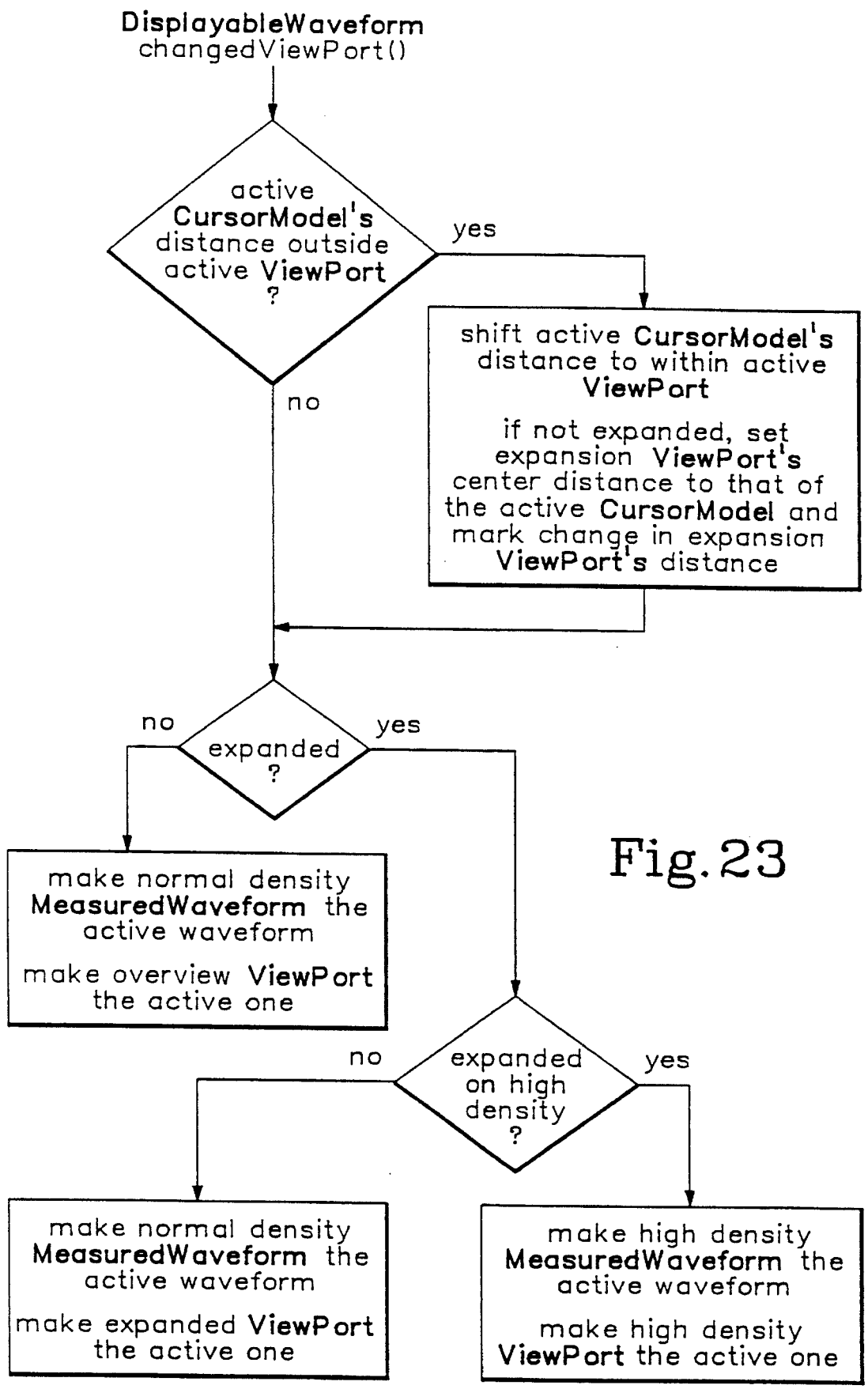

The ViewPort objects response to the cursor being moved or switched are shown in FIG. 22 and the effects of changes on the ViewPort objects are shown in FIG. 23. A different action is taken depending on whether the waveform is being viewed in expanded mode or overview mode. FIG. 23 also shows how the switch is made between viewing high density or normal density data. Recall that the WaveformDisplay update() routine (FIG. 20) sets up the DpyWfrmObj to point to the data in the active MeasuredWaveform object. If the waveform is expanded far enough to view high density data, i.e. if high density data exists, and if the expansion reaches the normal density limit, then the high density MeasuredWaveform is made active. If there is no high density data, then the normal density MeasuredWaveform remains the active one and the user is prompted to press the START/STOP button to acquire high density data. The high density MeasuredWaveform is not active in the IntelliTrace™ mode.

Figure 24:
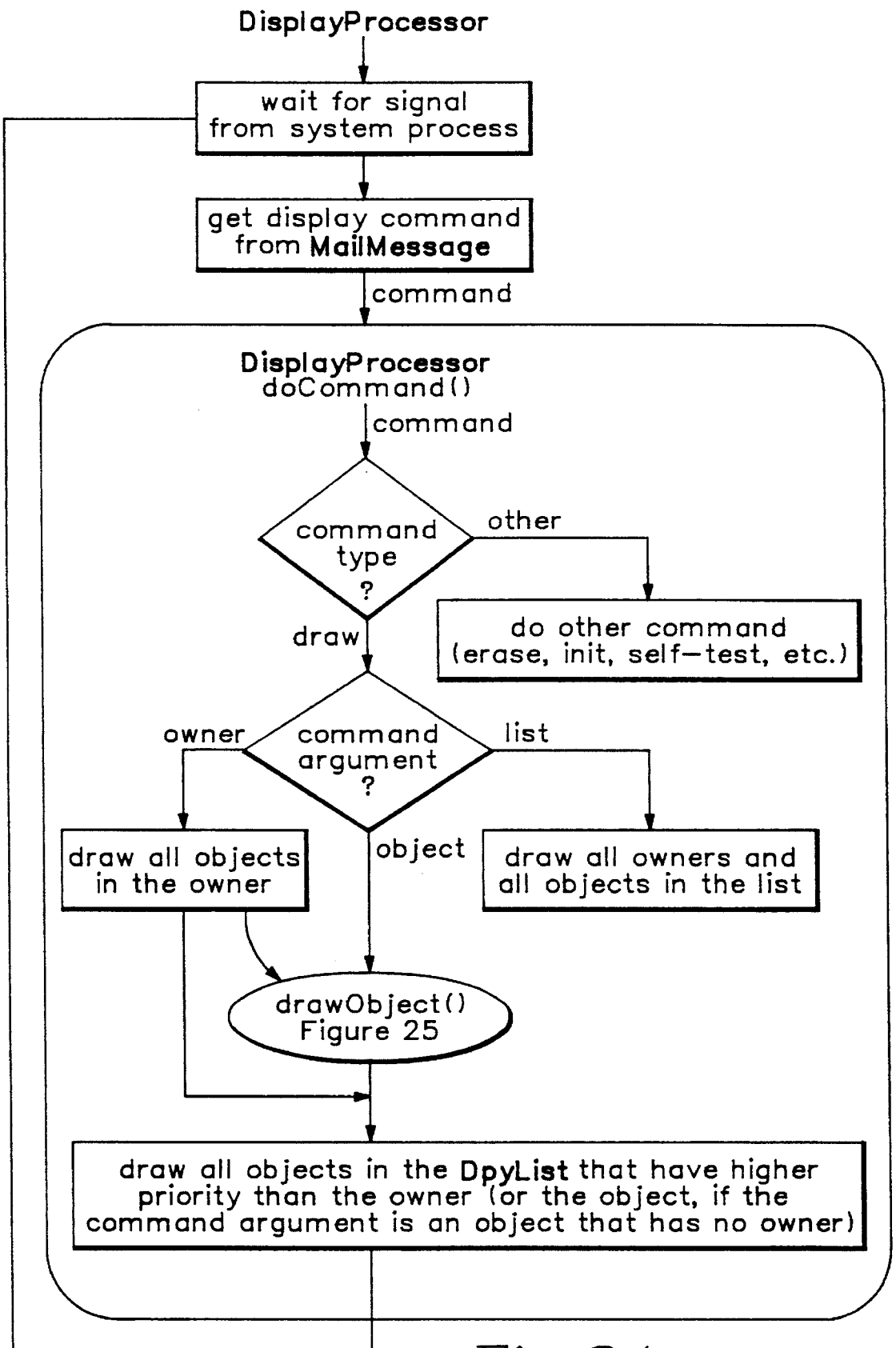
Figure 25:
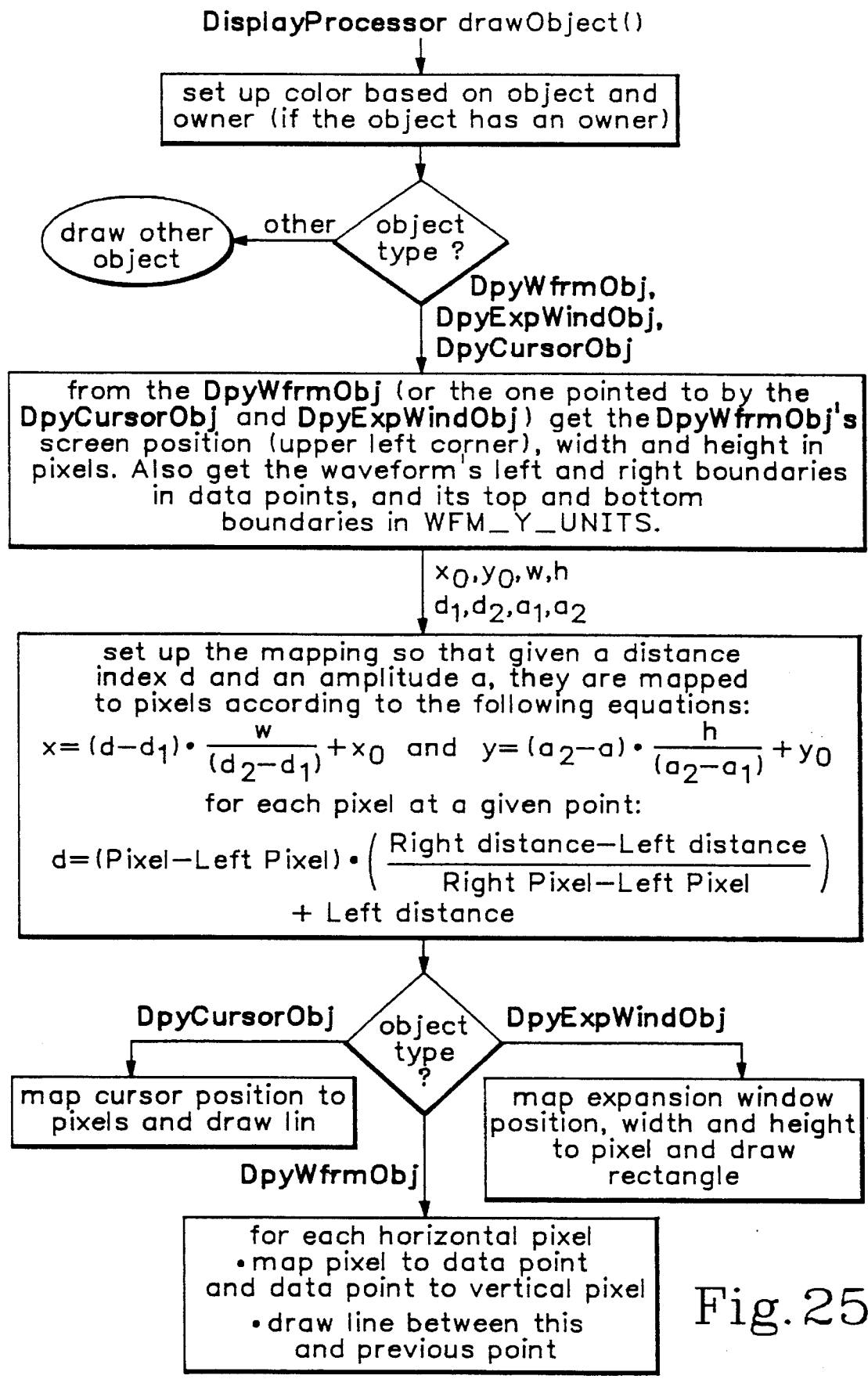

The main loop for the display process is shown in FIG. 24. When the instrument controller 50 signals the display process that there is a display command in the mailbox, the display process retrieves the command from the MailMessage left in the mailbox by the instrument controller 50. While the display process can carry out other commands like erase, initialize (restart), and various diagnostic procedures, the draw command is the one shown in the figure. It is used when objects need to be updated on the screen because they have changed in some way (position, color etc.). An object is drawn by drawing a list of which it is a member, which may be the DpyList of all objects in the system, by drawing an owner to which it is a member, or by drawing the objects individually. In the present invention, the waveform, expansion window and cursor object are drawn by drawing their common owner since they typically overlap and drawing one requires that the other be redrawn. An owner is drawn by drawing each of the objects in the list, as shown in FIG. 25. Once the owner is drawn, all other objects which overlap it are redrawn. This is done by traversing the DpyList, which is stored by priority, and drawing all objects and owners, which have higher priority than the owner that was specified in the draw command.

Figure 26:
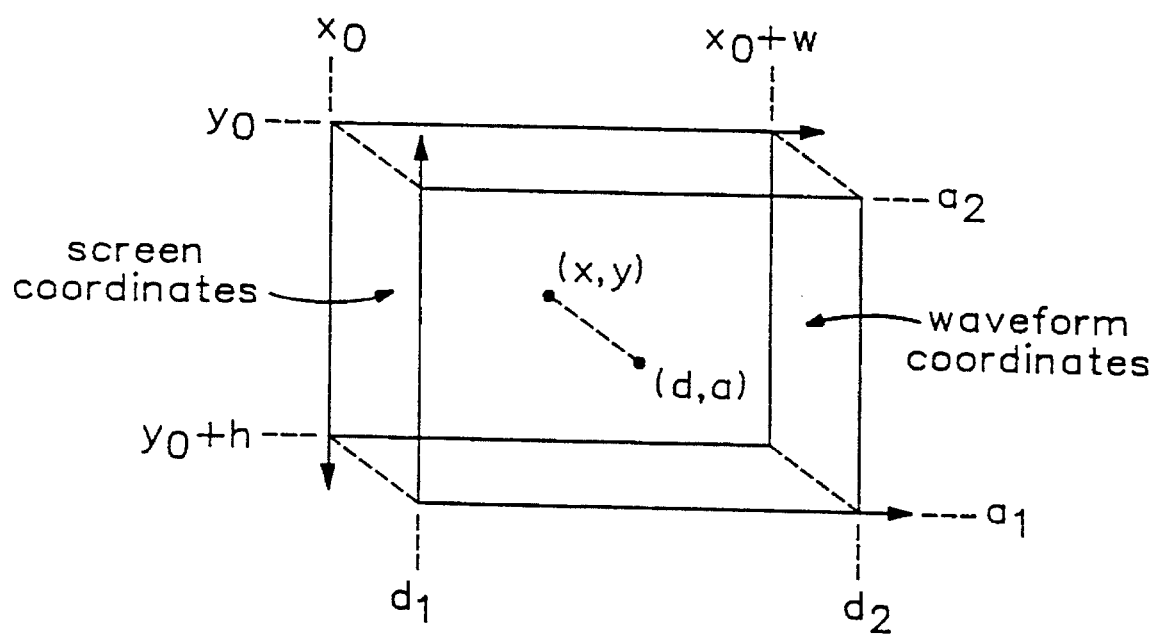
FIG. 26 shows the relationship between waveform coordinates and display coordinates in the optical time domain reflectometer using the method for displaying wavform segments having different sample densities as a waveform trace according to the present invention.

FIG. 25 shows how the expansion window, cursors and waveform are drawn. As with other objects, the color in which the object is drawn is set. Then the waveform coordinates (WFM_X_UNITS and WFM_Y_UNITS) and display area coordinates (pixels) used for mapping between the coordinate systems are retrieved. For the DpyCursorObj and DpyExpWindObj, the mapping is done according to DpyWfrmObj on which they are to be drawn. Recall that each DpyCursorObj and DpyExpWindObj has a pointer to a DpyWfrmObj. With these coordinate values, which specify the boundaries of a window in each coordinate system, a mapping function is initialized to map waveform coordinates to display area or screen coordinates. Notice that in the equation for the y pixel coordinate, the relative position (the quantity in square brackets) is calculated as a distance from the top of the waveform coordinate window, $a_2$. This is because the origin of the display area coordinate system used by the display process is in the upper left corner of the display area 92 with the positive direction of the vertical dimension going downward in the display area. FIG. 26 shows the relationship between the coordinate systems.

It will be appreciated that the invention is not restricted to the particular embodiment using the described objects exhibiting the above behaviors. Another set of objects may be used, which exhibit different individual behaviors but having their combined behaviors result in the optical time domain reflectometer storing waveform data having at least two waveform segments with each segment having data points acquires using different pulsewidths, sample spacing and starting distances and displaying the waveform data as a waveform trace on a display device as set forth in the appended claims. In addition, other traditional programming languages, such as C, Pascal, assembly, and the like, may be used without departing from the scope of the invention as defined in the appended claims and equivalents thereof.

What is claimed is:

1. An optical time domain reflectometer for launching optical pulses into a fiber under test for generating an optical return signal from the test fiber for acquiring and displaying waveform data as a waveform trace on a display device having a display area defined by a number of horizontal pixels and a number of vertical pixels and a viewport defined by a start distance and an end distance and min and max amplitudes comprising:

an acquisition system for acquiring at least two waveform segments having data points representative of the optical return signal with each waveform data point having an amplitude value related by time to a distance and each waveform segment being acquired using a different pulsewidth optical pulse, a different sample spacing and a different staring distance;

a processor for receiving and storing the data points of the waveform segments in an array, for determining the starting distances of the waveform segments, for generating a waveform data segment table containing the start distances, the sample spacing and an index into the array of waveform data points related to distance for each waveform segment, and for generating a bit map array representative of the waveform trace by establishing a horizontal pixel skip value, establishing a horizontal distance skip value, calculating a horizontal distance per pixel skip value for the display area as a function of dividing the distance between the viewport start distance and the viewport end distance by the number of horizontal pixels in the display area, mapping the horizontal pixels to distances by setting an initial pixel count to zero and an initial horizontal distance value to the viewport start distance and sequentially adding the horizontal pixel skip value to the pervious pixel count and adding the horizontal distance skip value to the previous horizontal distance value, correlating the distance values for the horizontal pixels to the amplitude values of the data points of the waveform segment using the indexes of the data points related to distance and mapping the amplitude values to the appropriate vertical pixels associated with the horizontal pixels;

a memory for storing the amplitude value of each data point of the respective waveform segments, the waveform segment table, and the bit map array representative of the waveform trace; and a display means including a display controller coupled to the display device for receiving and displaying the bit map representation of the waveform trace on the display device.

2. The optical time domain reflectometer as recited in claim 1 wherein the waveform trace is updated with the array of waveform data points for each acquisition of a waveform segment.

3. The optical time domain reflectometer as recited in claim 1 wherein the bit map array and the waveform trace are updated with the array of waveform data points concurrently with the acquisition of the next waveform segment.

4. The optical time domain reflectometer as recited in claim 1 wherein the processor establishes the horizontal pixel skip value to one and the horizontal distance skip value to the horizontal distance per pixel value.

5. The optical time domain reflectometer as recited in claim 1 wherein the processor calculates a new horizontal pixel skip value as a function of dividing the sample spacing of the waveform segment by the horizontal distance per pixel value and establishes a new horizontal distance skip value equal to the sample spacing of the waveform segment if the horizontal distance per pixel value is less than the sample spacing of the waveform segment.

6. The optical time domain reflectometer as recited in claim 1 wherein the processor determines a distance value for the last data point in the array of waveform data as a function of the index into the array of waveform data points related to distance, stores the distance value for the last data point in the waveform segment, compares the distance value of the last data point in the waveform segment to the horizontal pixel distances, and terminates the mapping of the waveform data to the bit map array when the horizontal pixel distance is greater than the distance value of the last data point of the waveform segment.

7. The optical time domain reflectometer as recited in claim 1 wherein the processor compares the start distance of the first waveform segment to the horizontal pixel distances and increments the horizontal pixel count and the horizontal distance value while the horizontal pixel distance is less than the starting distance of the first waveform segment.

8. In an optical time domain reflectometer storing an array of waveform data points having at least two waveform segments with each waveform segment having data points acquired using different pulsewidths, sample spacings and starting distances and each data point having an amplitude value and an index into the array of waveform data points related to distance, a method of displaying the waveform data as a waveform trace on a display device having a display area defined by a number of horizontal pixels and a number of vertical pixels and a viewport defined by a start distance and an end distance and min and max amplitudes comprising the steps of:

a) establishing a horizontal pixel skip value and a horizontal distance skip value;

b) calculating a horizontal distance per pixel value for the display area as a function of dividing the distance between the viewport start distance and the viewport end distance by the number of horizontal pixels in the display area;

c) mapping the horizontal pixels to distances by setting an initial pixel count to zero and sequentially adding the horizontal pixel skip value to the pervious pixel count and setting an initial horizontal distance value to the start distance of the viewport and sequentially adding the horizontal distance skip value to the previous horizontal distance value;

d) correlating the distance values for the horizontal pixels to the amplitude values of the data points of the waveform segment using the indexes of the data points related to distance;

e) mapping the amplitude values to the appropriate vertical pixels associated with the horizontal pixels in a bit mapped video frame buffer for displaying on the display device; and f) repeating steps c, d, and e using the subsequent waveform segments for producing the waveform trace of the waveform data on the display device as the distance values for the horizontal pixels extend beyond the starting distance of the subsequent segments.

9. The method of displaying waveform data as recited in claim 8 further comprising the preliminary step of generating a waveform data segment table for the array of waveform data points having the starting distances for the waveform segments, the sample spacings for the waveform segments, and the indexes to the first data points of the waveform segments in the array of waveform data points related to distances.

10. The method of displaying waveform data as recited in claim 9 further comprising the steps of:

a) acquiring and storing the data points for the first waveform segment in the array of waveform data points;

b) performing steps (a) through (e) on the array of waveform data points prior to updating the array of waveform data points and waveform data segment table with data points from a subsequent waveform segment acquisition; and c) repeating steps (a) through (f) on the array of waveform data points for each subsequent waveform segment prior to updating the array of waveform data points and the waveform data segment table with data points from additional waveform segment acquisitions.

11. The method of displaying waveform data as recited in claim 8 further comprising the steps of:

a) acquiring and storing the data points for the first waveform segment in the array of waveform data points;

b) generating a waveform data segment table for the array of waveform data points of the first waveform segment having the starting distance for the waveform segment, the sample spacing for the waveform segment, and the index for the segment into the array of waveform data points related to distances;

c) performing steps (a) through (e) on the array of wavform data points concurrently with acquiring data points for a subsequent waveform segment; and d) updating the array of waveform data points and the waveform data segment table with data points from the subsequent waveform segment acquisition and performing steps (a) through (f) on the array of waveform data points for each subsequent waveform segment concurrently with acquiring data points for additional waveform segments.

12. The method of displaying waveform data as recited in claim 8 further comprising the step of setting the horizontal pixel skip value to one and the horizontal distance skip value to the horizontal distance per pixel value.

13. The method of displaying waveform data as recited in claim 8 wherein the calculating step (b) further comprises the steps of:
   a) calculating a new horizontal pixel skip value as a function of dividing the sample spacing of the waveform segment by the horizontal distance per pixel value; and
   b) establishing the horizontal distance per pixel value equal to sample spacing of the waveform segment if the horizontal distance skip value is less than the sample spacing of the waveform segment.

14. The method of displaying waveform data as recited in claim 8 wherein the mapping step (c) further comprises the steps of:
   a) determining a distance value for the last data point in the waveform segment as a function of the index into the array of waveform data points related to distance;
   b) storing the distance value for the last data point in the waveform segment;
   c) comparing the distance value of the last data point in the waveform segment to the horizontal pixel distances; and
   d) terminating the displaying of the waveform data when the horizontal pixel distance is greater than the distance value of the last data point of the waveform segment.

15. The method of displaying waveform data as recited in claim 8 wherein the mapping step (c) further comprises the steps of:
   a) comparing the start distance of the first waveform segment to the horizontal pixel distances; and
   b) incrementing the horizontal pixel count by adding the horizontal pixel skip value to the previous pixel count and incrementing the horizontal distance value by the horizontal distance skip value to the previous distance value while the horizontal pixel distance is less than the starting distance of the first waveform segment.

16. The method of displaying waveform data as recited in claim 8 wherein the correlating step (d) further comprises the steps of:
   a) comparing the horizontal pixel distance value to the starting distances of the various waveform segments for determining the waveform segment containing the data point to be correlated to the horizontal pixel;
   b) determining the distance from the starting distance of the waveform segment determined in step (a) to the data point correlated to the horizontal pixel as a function of subtracting the starting distance for the waveform segment from the horizontal pixel distance;
   c) determining the index of the data point correlated to the horizontal pixel as a function of dividing the result of step (b) by the sample spacing for the waveform segment and adding the index of the starting distance for the waveform segment; and
   d) accessing the amplitude value for the horizontal pixel using the results in step (c) as the index into the array of waveform data points containing the amplitude values of the data points.

\* \* \* \* \*

UNITED STATES PATENT AND TRADEMARK OFFICE
CERTIFICATE OF CORRECTION

PATENT NO. : 5,528,356
DATED : June 18, 1996
INVENTOR(S) : Matthew S. Harcourt

It is certified that error appears in the above-indentified patent and that said Letters Patent is hereby corrected as shown below:

Drawings:

Figure 1, box 30 - change to APD--

Figure 1, add lead arrow and numeral 10 pointing to Figure 1 block diagram--.

Signed and Sealed this

Eighteenth Day of February, 1997

Attest:

BRUCE LEHMAN

*Attesting Officer*   *Commissioner of Patents and Trademarks*